(12) United States Patent
Aoki

(10) Patent No.: US 7,977,756 B2
(45) Date of Patent: Jul. 12, 2011

(54) SEMICONDUCTOR STORAGE DEVICE USING MAGNETORESISTIVE EFFECT ELEMENT AND METHOD OF MANUFACTURING THE SAME

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 211 days.

(21) Appl. No.: 12/400,465

(22) Filed: Mar. 9, 2009

(65) Prior Publication Data

US 2009/0224331 A1  Sep. 10, 2009

(30) Foreign Application Priority Data

Mar. 10, 2008  (JP) ................................. 2008-059134

(51) Int. Cl.
*H01L 27/14* (2006.01)
*G11C 11/44* (2006.01)
(52) U.S. Cl. ......... 257/414; 257/E21.645; 257/E21.885; 365/158
(58) Field of Classification Search ............... 257/379, 257/295, E27.081, E21.645, 108, 414, E21.885; 438/238, 473, 476; 365/145, 148, 158
See application file for complete search history.

(56) References Cited

U.S. PATENT DOCUMENTS

| | | | | |
|---|---|---|---|---|
| 6,226,197 | B1 * | 5/2001 | Nishimura | 365/171 |
| 2004/0084702 | A1 * | 5/2004 | Jeong | 257/295 |
| 2008/0192531 | A1 * | 8/2008 | Tamura et al. | 365/148 |
| 2008/0239782 | A1 * | 10/2008 | Asao | 365/63 |

FOREIGN PATENT DOCUMENTS

| | | |
|---|---|---|
| JP | 9-186255 A | 7/1997 |
| JP | 9-321152 A | 12/1997 |
| JP | 2006-272056 | * 10/2006 |
| WO | WO2007/046145 | * 4/2007 |

OTHER PUBLICATIONS

M. Hosomi et al.; "A Novel Nonvolatile Memory with Spin Toque Transfer Magnetization Switching: Spin-RAM"; IEEE International Electron Devices Meeting Technical Digest, 2005, pp. 458-462.

* cited by examiner

*Primary Examiner* — Thomas L Dickey
*Assistant Examiner* — Nikolay Yushin
(74) *Attorney, Agent, or Firm* — Westerman, Hattori, Daniels & Adrian, LLP

(57) ABSTRACT

A semiconductor storage device includes a semiconductor substrate, a source region, a source line, and a bit line. The source region is formed in an element region formed on the semiconductor substrate. The source line is formed to overlap with the source region in planar view. The bit line is formed on a layer higher than the source line.

4 Claims, 21 Drawing Sheets

SEMICONDUCTOR STORAGE DEVICE USING MAGNETORESISTIVE EFFECT ELEMENT AND METHOD OF MANUFACTURING THE SAME

CROSS-REFERENCE TO RELATED APPLICATIONS

This application is based upon and claims the benefit of priority of the prior Japanese Patent Application No. 2008-59134, filed on Mar. 10, 2008 the entire contents of which are incorporated herein by reference.

FIELD

The present invention relates to a semiconductor storage device and a method of manufacturing the same; in particular, a semiconductor storage device which can realize miniaturization and high integration density and a method of manufacturing the same.

BACKGROUND

In recent years, as a rewritable nonvolatile memory, a magnetic random access memory (hereinafter referred to as "MRAM" as an abbreviation) has attracted attention. The MRAM stores information by using a combination of magnetization directions in two magnetic layers and detects changes in resistance (i.e., changes in current or voltage) occurring when the magnetization directions in the magnetic layers are parallel and when the magnetization directions in the magnetic layers are antiparallel to each other to read storage information.

As the MRAM, a spin torque transfer magnetization switching (Spin Torque Transfer Magnetization Switching) type MRAM has attracted attention. In the spin torque transfer magnetization switching type MRAM, for example, a magnetic tunnel junction element (hereinafter referred to as "MTJ element" as an abbreviation) is used as a magnetoresistive effect element.

The MTJ element is a magnetoresistive effect element having a configuration in which a tunnel barrier layer is interposed between a magnetization free layer and magnetization fixed layer.

In the MTJ element, when a current is caused to flow from the magnetization free layer side to the magnetization fixed layer side, electrons with a spin having the same direction as that of a spin of the magnetization fixed layer are injected into the magnetization free layer. For this reason, the direction of the spin of the magnetization free layer is equal to the direction of the spin of the magnetization fixed layer, a magnetization moment of the magnetization free layer becomes parallel, and a resistance of a magnetic tunnel junction becomes relatively small. A state in which the resistance of the magnetic tunnel junction is relatively small is associated with, for example, data "0".

On the other hand, when the current is caused to flow from the magnetization fixed layer side to the magnetization free layer side, electrons with a spin having a direction opposing the direction of the spin of the magnetization fixed layer are reflected by the magnetization fixed layer and injected into the magnetization free layer. For this reason, the direction of the spin of the magnetization free layer is opposite to the direction of the spin of the magnetization fixed layer, the magnetization moment of the magnetization free layer is antiparallel, and the resistance of the magnetic tunnel junction becomes relatively large. A state in which the resistance of the magnetization tunnel function is relatively large is associated with, for example, data "1".

In the MRAM using an MTJ element, when directions of a current caused to flow into the MTJ element are changed, information is written in the MTJ element. For this reason, in the MRAM using the MTJ element, two lines for writing are necessary. One of the two lines for writing is a bit line, and the other is a source line. The bit line and the source line are formed to extend in the same direction.

However, when both the bit line and the source line are simply laid out to extend in the same direction, a size of a memory cell in the extending direction of the word line becomes relatively large.

SUMMARY

According to one aspect of the invention, a semiconductor storage device includes a semiconductor substrate, a source region, a source line, and a bit line. The source region is formed in an element region formed on the semiconductor substrate. The source line is formed to overlap with the source region in planar view. The bit line is formed on a layer higher than the source line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DETAILED DESCRIPTION OF THE EMBODIMENTS

First Embodiment

Figure 1:
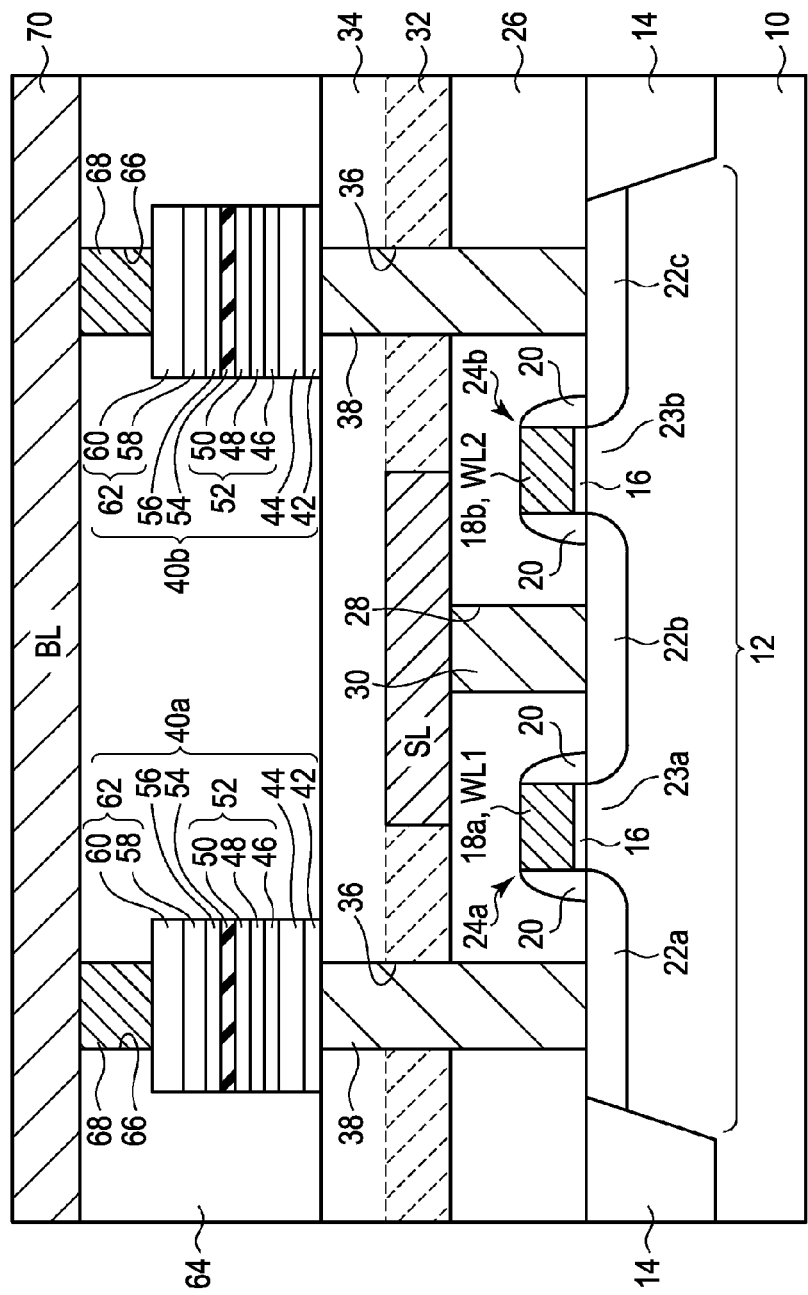
FIG. 1 is a sectional view showing a semiconductor storage device according to a first embodiment of the present invention.
Figure 2:
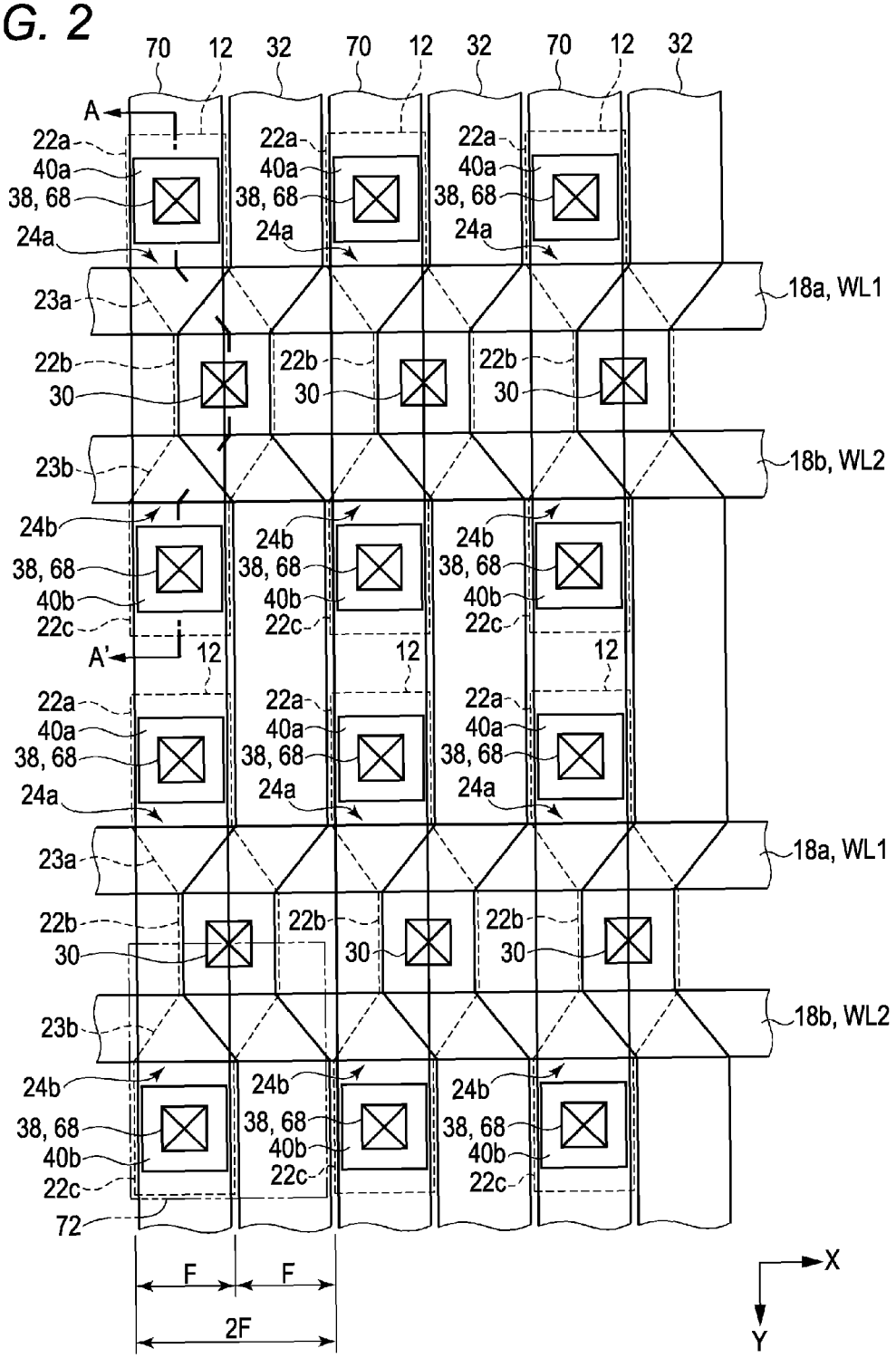
FIG. 2 is a plan view showing a semiconductor storage device according to the first embodiment.
Figure 3:
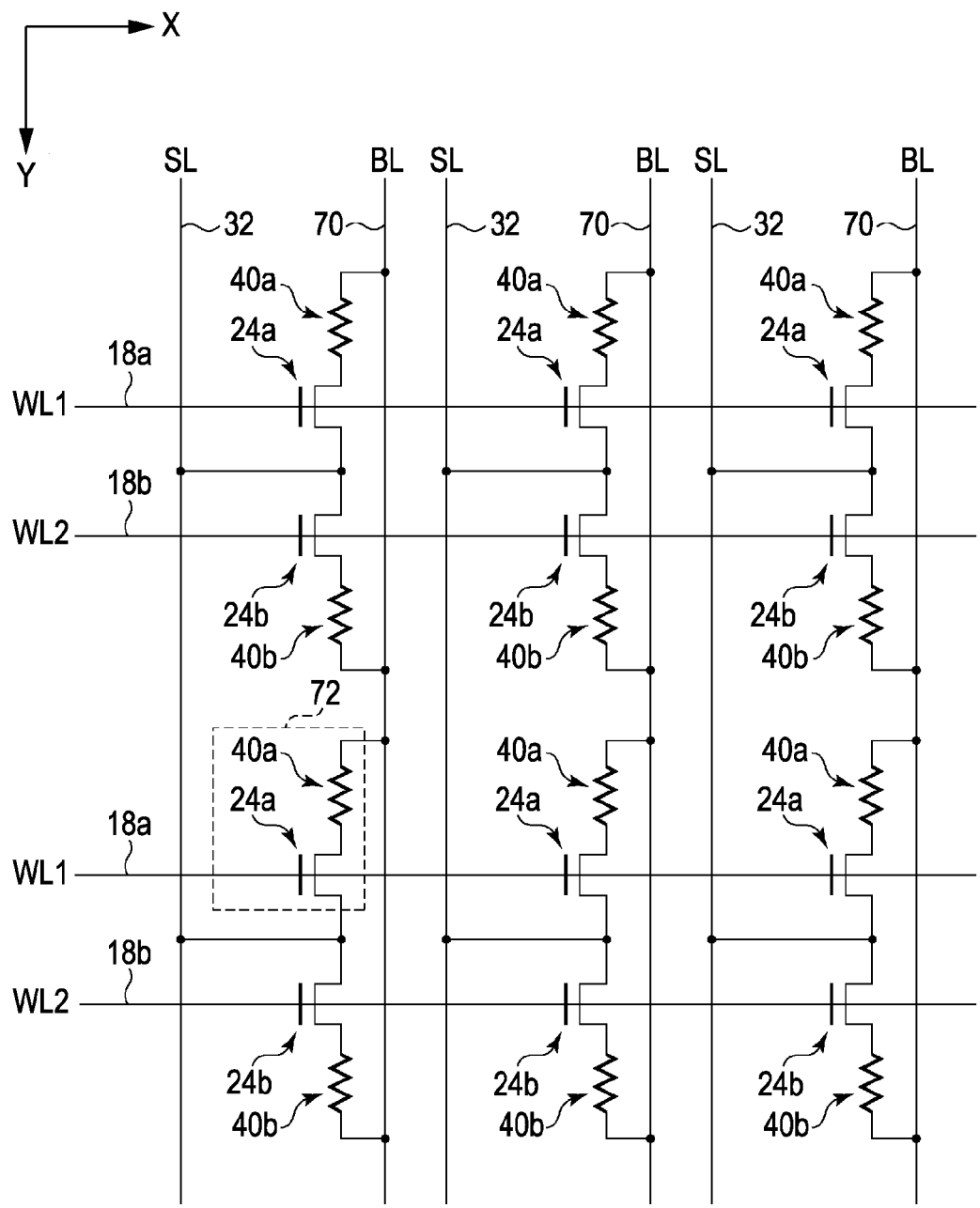
FIG. 3 is a circuit diagram showing a semiconductor storage device according to the first embodiment.
Figure 4:
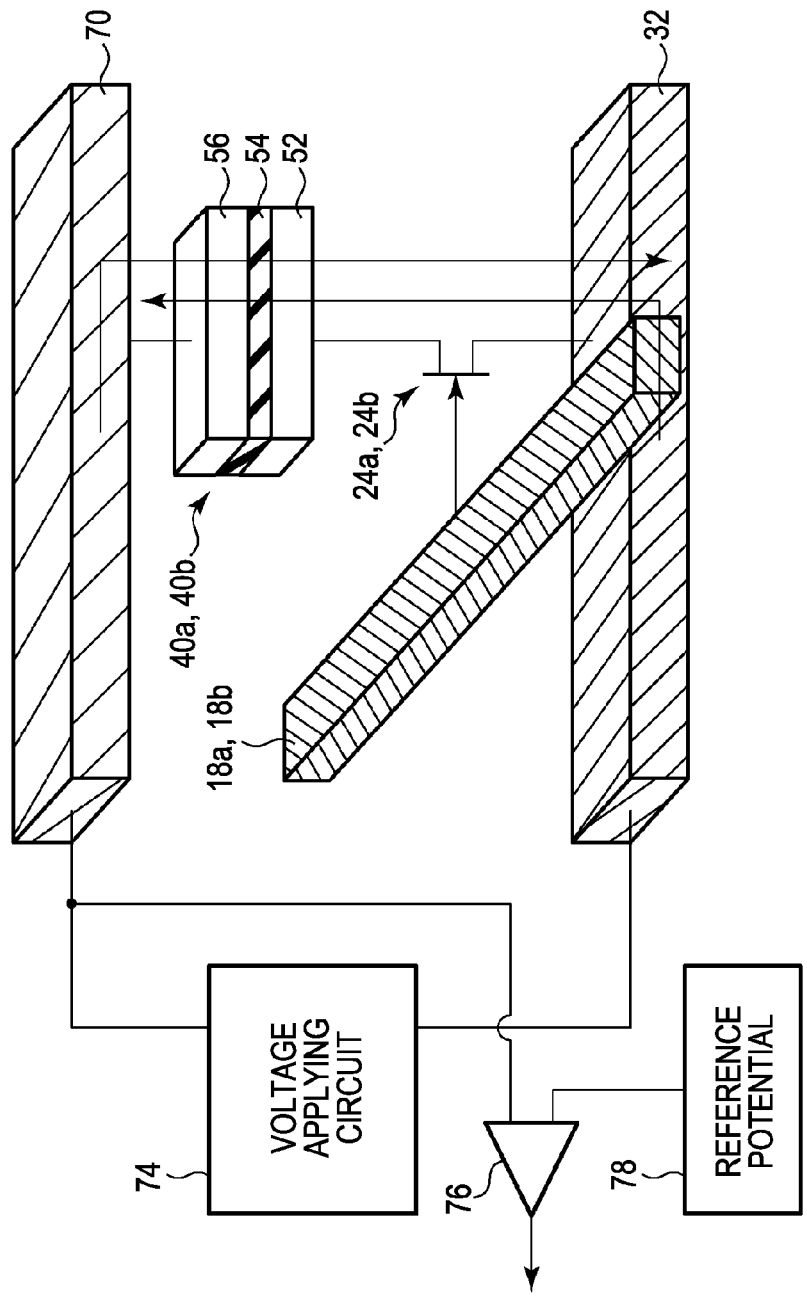
FIG. 4 is a circuit diagram schematically showing a semiconductor storage device according to the first embodiment.

A semiconductor storage device according to a first embodiment and a method of manufacturing the same will be described below with reference to FIG. 1 to FIG. 15B. FIG. 1 is a sectional view showing a semiconductor storage device according to the present embodiment. FIG. 2 is a plan view showing the semiconductor storage device according to the present embodiment. FIG. 1 corresponds to an A-A' section in FIG. 2. FIG. 3 is a circuit diagram showing the semiconductor storage device according to the present embodiment. FIG. 4 is a schematic view showing a circuit configuration of the semiconductor storage device according to the present embodiment.

(Semiconductor Storage Device)

As shown in FIG. 1, for example, on a semiconductor substrate 10 constituted by a silicon substrate, an element isolation region 14 which lays out an element region (active region) 12 is formed.

On the semiconductor substrate 10, there is formed a first word line WL1 extending in an X direction. The first word line WL1 is formed to intersect with the element region 12. The first word line WL1 includes a gate electrode 18a of a first transistor 24a.

On the semiconductor substrate 10, there is formed a second word line WL2 extending in the X direction. The second word line WL2 is formed to be parallel to the first word line WL1. The second word line WL2 is formed to intersect with the element region 12. The second word line WL2 includes a gate electrode 18b.

A side wall insulating film 20 is formed on side wall portions of the gate electrodes 18a and 18b.

In the element region 12 on one side of the first gate electrode 18a, a first drain region 22a is formed. In the element region 12 on the other side of the first gate electrode 18a, a source region 22b is formed. A region between the first drain region 22a and a source region 22b serves as a channel region 23a.

In this manner, the first transistor 24a having the first gate electrode 18a, the first drain region 22a, and the source region 22b is configured.

In the element region 12 on one side of the second gate electrode 18b, the source region 22b is formed. The source region 22b of the first transistor 24a and the source region 22b of a second transistor 24b are constituted by the common source region 22b. In the element region 12 on the other side of the second gate electrode 18b, a second drain region 22c is formed. A region between the source region 22b and the second drain region 22c serves as a channel region 23b.

In this manner, the second transistor 24b having the gate electrode 18b and the source/drain regions 22b and 22c is configured.

The element region 12, as shown in FIG. 2, is formed on a region extending from the region in which the first drain region 22a of the first transistor 24a is formed to the region in which the second drain region 22c of the second transistor 24b is formed. The region in which the second drain region 22c of the second transistor 24b is formed is located in a Y direction with reference to the region in which the first drain region 22a of the first transistor 24a is formed. Note that the Y direction is perpendicular to the X direction.

As shown in FIG. 2, the channel region 23a is formed to be oblique with reference to the Y direction.

The source region 22b is deviated in the X direction with reference to the first drain region 22a of the first transistor 24a and the second drain region 22c of the second transistor 24b.

The channel region 23b is formed to be oblique with reference to the Y direction.

In this manner, in the present embodiment, the element region 12 is bent such that the source region 22b is deviated in the X direction with reference to the first drain region 22a and the second drain region 22c.

A width of the first drain region 22a of the first transistor 24a, a width of the channel region 23a of the first transistor 24a, a width of the channel region 23b of the second transistor 24b, and a width of the second drain region 22c of the second transistor 24b are set to be equal to each other. More specifically, in the present embodiment, the element region 12 is formed with a uniform width.

On the semiconductor substrate 10 on which the first word line WL1 and the second word line WL2 are formed, for example, an insulating interlayer 26 constituted by a silicon oxide film is formed.

In the insulating interlayer 26, a contact hole 28 reaching the element region 12 is formed between the first word line WL1 and the second word line WL2. A conductor plug 30 is buried in the contact hole 28.

On the insulating interlayer 26, a source line (SL) 32 is formed to extend in the Y direction as a whole. The source line 32 is formed in a region including a region adjacent to the first drain region 22a of the first transistor 24a and a region adjacent to the second drain region 22c of the second transistor 24b.

A portion adjacent to the first drain region 22a on the source line 32 is located in the X direction with reference to the first drain region 22a of the first transistor 24a. A portion adjacent to the second drain region 22c of the source line 32 is located in the X direction with reference to the second drain region 22c of the second transistor 24b.

A portion of the source line 32 located on the first word line WL1 is formed to be oblique with reference to the Y direction. A portion of the source line 32 located on the region between the first word line WL1 and the second word line WL2 is deviated in a direction opposing the X direction with reference to the first drain region 22a of the first transistor 24a and the second drain region 22c of the second transistor 24b. A portion on the second word line WL2 on the source line 32 is formed to be oblique with reference to the Y direction. In this manner, in the present embodiment, the source line 32 is bent such that a portion on the region between the first word line WL1 and the second word line WL2 on the source line 32 is deviated in the direction opposing the X direction.

A portion of the element region 12 formed between the first word line WL1 and the second word line WL2 is deviated in the X direction, and a portion of the source line 32 located on a region between the first word line WL1 and the second word line WL2 is deviated in the direction opposing the X direction. For this reason, the element region 12 overlaps with the source line 32 in the region between the first word line WL1 and the second word line WL2 in planar view. The portion of the element region 12 located between the first word line WL1 and the second gate electrode 18b and the portion of the source line 32 located on the region between the first word line WL1 and the second word line WL2 are electrically connected to each other by the conductor plug 30.

On the insulating interlayer 26 on which the source line 32 is formed, an insulating interlayer 34 constituted by, for example, a silicon oxide film is formed.

A contact hole 36 reaching the first drain region 22a of the first transistor 24a is formed in the insulating interlayers 26 and 34. A conductor plug 38 is buried in the contact hole 36.

Furthermore, a contact hole 36 reaching the second drain region 22c of the second transistor 24b is formed in the insulating interlayers 26 and 34. A conductor plug 38 is buried in the contact hole 36.

On the insulating interlayer 34 in which the conductor plug 38 is buried, a magnetoresistive effect elements (storage elements) 40a and 40b, more specifically MTJ elements 40a and 40b are formed. The magnetoresistive effect elements 40a and 40b, for example, have an underlying layer 42 formed on the insulating interlayer 34, an antiferromagnetic layer 44 formed on the underlying layer 42, a magnetization fixing layer (pinned layer) 52 formed on the antiferromagnetic layer 44 and having a fixed magnetization direction, a tunnel barrier layer 54 formed on the magnetization fixing layer 52, a magnetization free layer (free layer) 56 formed on the tunnel barrier layer 54 and a variable magnetization direction, and a cap layer 62 formed on the magnetization free layer 56.

As the underlying layer 42, for example, a Ta layer having a film thickness of 10 nm is used.

As the antiferromagnetic layer 44, for example, a PtMn layer having a film thickness of 15 nm is used.

The magnetization fixing layer 52 is structured by, for example, a laminated film obtained by sequentially laminating a CoFe film 46, an Ru film 48, and a CoFeB film 50. A film thickness of the CoFe film 46 is set to, for example, 1.7 nm. A film thickness of the Ru film 48 is set to, for example, 0.68 nm. A film thickness of the CoFeB film 50 is set to, for example, 2.2 nm.

As the tunnel barrier layer 54, for example, an MgO film having a film thickness of 1.2 nm is used.

As the magnetization free layer 56, for example, an CoFeB film having a film thickness of 2 nm is used.

The cap layer 62, for example, is constituted by a laminated film obtained by sequentially laminating an Ru film 58 and a Ta film 60. A film thickness of the Ru film 58 is set to, for example, 10 nm. A film thickness of the Ta film 60 is set to, for example, 30 nm.

The underlying layer (lower electrode) 42 of the first storage element 40a is connected to the first drain region 22a of the first transistor 24a through the conductor plug 38.

The underlying layer (lower electrode) 42 of the second storage element 40b is connected to the second drain region 22c of the second transistor 24b through the conductor plug 38.

A memory cell 72 is constituted by the first transistor 24a and the first storage element 40a. A memory cell 72 is also constituted by the second transistor 24b and the second storage element 40b.

On the insulating interlayer 34 on which the first storage element 40a and the second storage element 40b are formed, for example, an insulating interlayer 64 constituted by a silicon oxide film is formed.

In the insulating interlayer 64, a contact hole 66 reaching the cap layer (upper electrode) 62 of the first storage element 40a is formed. In the insulating interlayer 64, a contact hole 66 reaching the cap layer (upper electrode) 62 of the second storage element 40b is formed. In the contact holes 66, conductor plugs 68 are buried, respectively.

On the insulating interlayer 64 in which the conductor plugs 68 are buried, a bit line (BL) 70 is formed. The bit line 70 is formed on a region including the first drain region 22a of the first transistor 24a and the second drain region 22c of the second transistor 24b. The bit line 70 is formed on a layer above the source line. The bit line 70 is formed to extend in the Y direction. The bit line 70 is electrically connected to the upper electrode 62 of the first storage element 40a through the conductor plug 68. The bit line 70 is electrically connected to the upper electrode 62 of the second storage element 40b through the conductor plug 68.

The source line 32 and the bit line 70, as shown in FIG. 4, are connected to a voltage applying circuit 74. The voltage applying circuit 74 applies a predetermined voltage across the source line 32 and the bit line 70 when information is written in the magnetoresistive effect elements 40a and 40b. The voltage applying circuit 74 applies a predetermined voltage across the source line 32 and the bit line 70 when information written in the magnetoresistive effect elements 40a and 40b is read out.

The bit line 70 is connected to one input terminal of the sense amplifier 76. The other input terminal of the sense amplifier 76 is connected to a reference potential 78. The sense amplifier 76 outputs a signal depending on the information written in the magnetoresistive effect elements 40a and 40b.

A portion surrounded by a chain double-dashed line in FIG. 2 denotes a size of one memory cell 72. When a minimum processing size of the source line 32 or the bit line 70 is represented by F, in this embodiment, a size of one memory cell 72 in the X direction is given by 2 F.

In this manner, according to the present embodiment, even though both the source line 32 and the bit line 70 are formed to extend in the Y direction, the size of the memory cell 72 in the X direction can be minimized.

(Operation of Semiconductor Storage Device)

An operation of a semiconductor storage device according to the present embodiment will be described below with reference to FIG. 1 to FIG. 7B.

Figure 5A:
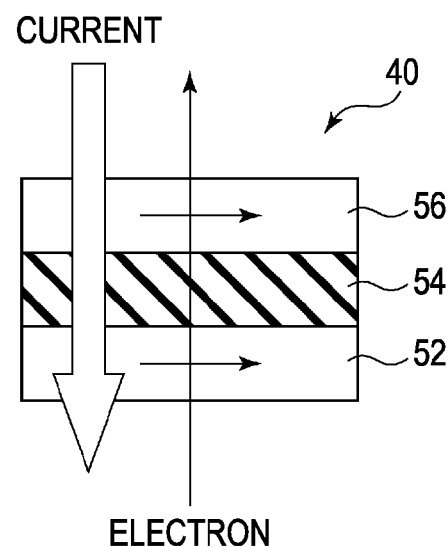
FIGS. 5A and 5B are a conceptual diagram and a time chart (part 1) showing a method of writing data in a magnetoresistive effect element.
Figure 5B:
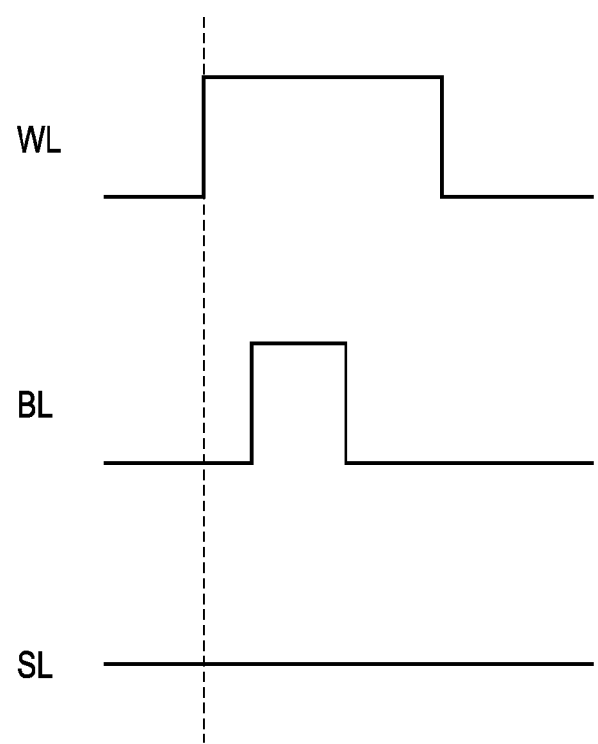

A method of writing data "0" in a memory cell will be described below with reference to FIGS. 5A and 5b. FIGS. 5A and 5B are a conceptual diagram and a time chart (part 1) showing a method of writing data in magnetoresistive effect element.

When data "0" is written in a memory cell, as shown in FIG. 5B, a voltage is applied across word lines 18a and 18b connected to the memory cell 72 (see FIG. 3) in which data is to be written. In this manner, the transistors 24a and 24b of the memory cell 72 in which data is to be written are set in an ON state.

As shown in FIG. 5B, a predetermined write voltage Vwrite is applied to the bit line (BL) 70 connected to the memory cell 72 in which data is to be written. On the other hand, a potential of the source line (SL) 32 connected to the memory cell 72 in which data is to be written is kept at 0 V. In this manner, as shown in FIG. 5A, a current flows from the magnetization free layer 56 side to the magnetization fixing layer 52 side. When the current flows from the magnetization free layer 56 side to the magnetization fixing layer 52 side, electrons with a spin having the same direction as that of a spin of the magnetization fixing layer 52 are injected into the magnetization free layer 56. At this time, the direction of the spin of the magnetization free layer 56 and the direction of the spin of the magnetization fixing layer 52 are the same, a magnetic moment of the magnetization free layer 56 becomes parallel, and the resistance of the magnetoresistive effect element 40 becomes relatively small. The state in which the resistance of the magnetoresistive effect element 40 is relatively small is associated with, for example, data "0". In this manner, the data "0" is written in the magnetoresistive effect element 40.

Figure 6A:
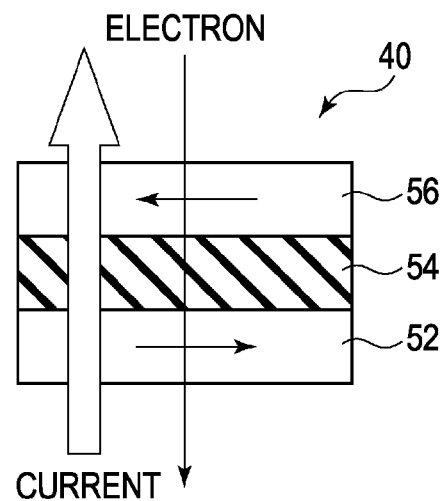
FIGS. 6A and 6B are a conceptual diagram and a time chart (part 2) showing the method of writing data in a magnetoresistive effect element.
Figure 6B:
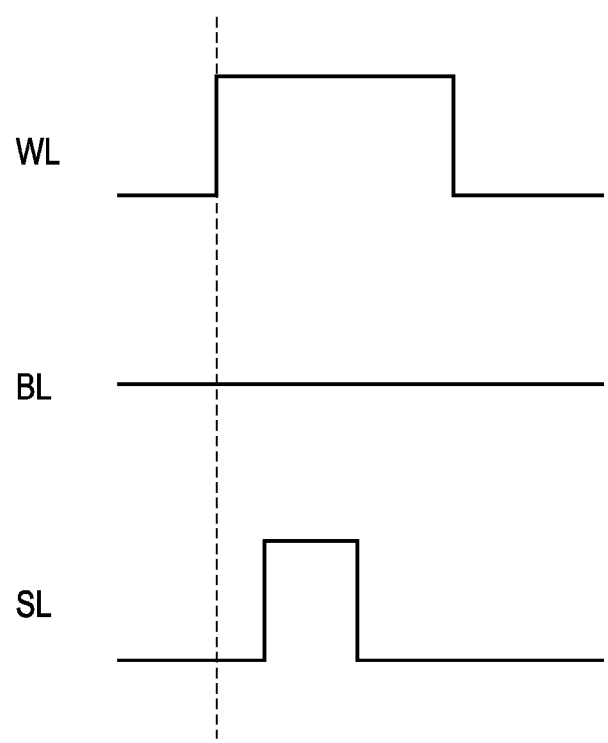

A method of writing data "1" in a memory cell will be described below with reference to FIGS. 6A and 6B. FIGS. 6A and 6B are a conceptual diagram and a time chart (part 1) showing a method of writing data in the magnetoresistive effect element.

When data "1" is written in a memory cell, as shown in FIG. 6B, a voltage is applied across the word lines (WL) 18a and 18b connected to the memory cell 72 (see FIG. 3) in which data is to be written. In this manner, the transistors 24a and 24b of the memory cell 72 in which data is to be written are set in an ON state.

As shown in FIG. 6b, the predetermined write voltage Vwrite is applied to the source line (SL) 32 connected to the memory cell 72 in which data is to be written. In this case, a predetermined positive voltage is applied to, for example, the source line (SL) 32. On the other hand, a potential of the bit line (BL) 70 connected to the memory cell 72 in which data is to be written is kept at 0 V. In this manner, as shown in FIG. 6a, a current flows from the magnetization fixing layer 52 side to the magnetization free layer 56 side. When the current flows from the magnetization fixing layer 52 side to the magnetization free layer 56 side, electrons with a spin having a direction opposing the direction of the spin of the magnetization fixing layer 52 are reflected by the magnetization fixing layer 52 and injected into the magnetization free layer 56. In this case, the direction of the spin of the magnetization free layer 56 and the direction of the spin of the magnetization fixing layer 52 are opposite to each other, a magnetic moment of the magnetization free layer 56 becomes antiparallel, and a resistance of the magnetoresistive effect element 40 becomes relatively large. The state in which the resistance of the magnetoresistive effect element 40 is relatively large is associated with, for example, data "1". In this manner, the data "1" is written in the magnetoresistive effect element 40.

Figure 7A:
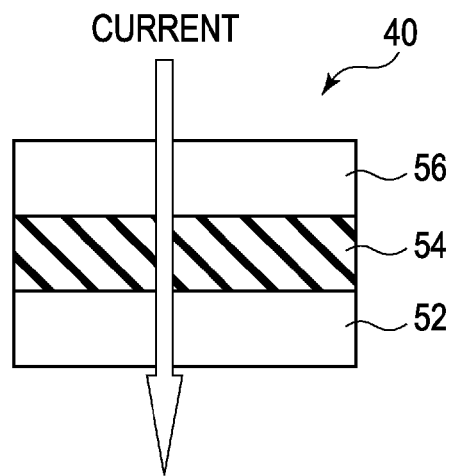
FIGS. 7A and 7B are a conceptual diagram and a time chart showing a method of reading data written in the magnetoresistive effect element.
Figure 7B:
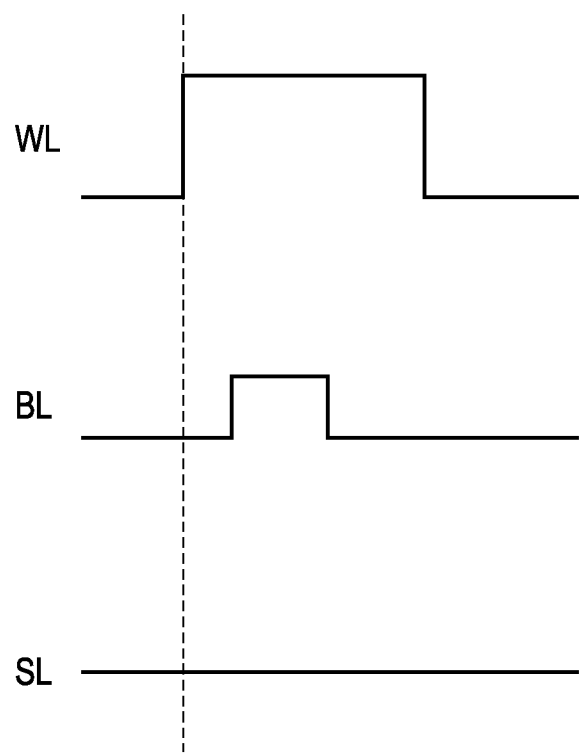

A method of reading data written in a memory cell will be described below with reference to FIGS. 7A and 7B. FIGS. 7A and 7B are a conceptual diagram and a time chart showing a method of reading data written in a magnetoresistive effect element.

When data written in a memory cell is read, as shown in FIG. 7B, a voltage is applied across word lines (WL) 18a and 18b connected to the memory cell 72 (see FIG. 3) from which data is to be read. In this manner, the transistors 24a and 24b of the memory cell 72 from which data is to be read are set in ON states.

As shown in FIG. 7B, a predetermined read voltage Vread is applied to the bit line (BL) 70 connected to the memory cell 72 from which data is to be read. The read voltage Vread is set to be lower than the write voltage Vwrite to write data in the magnetoresistive effect element 40. On the other hand, a potential of the source line (SL) 32 connected to the memory cell 72 from which data is to be read is kept at 0 V. In this case, a signal depending on the resistance of the magnetoresistive effect element 40 is output from the sense amplifier 76. When data "0" is written in the memory cell 72, a signal having, for example, a relatively high level is output from the sense amplifier 76. On the other hand, when data "1" is written in the memory cell 72, a signal having, for example, a relatively low level is output from the sense amplifier 76. In this manner, data written in the memory cell 72 is read.

(Method of Manufacturing a Semiconductor Storage Device)

A method of manufacturing a semiconductor storage device according to the present embodiment will be described below with reference to FIGS. 8A and 8B to FIGS. 15A and 15B. FIGS. 8A, 9A, 10A, 11A, 12A, 13, 14A, and 15A are sectional views. FIGS. 8B, 9B, 10B, 11B, 12B, 14B, and 15B are plan views. FIGS. 8A, 9A, 10A, 11A, 12A, 14A, and 15A are sectional views taken along A-A' lines in FIGS. 8B, 9B, 10B, 11B, 12B, 14B, and 15B, respectively.

Figure 8A:
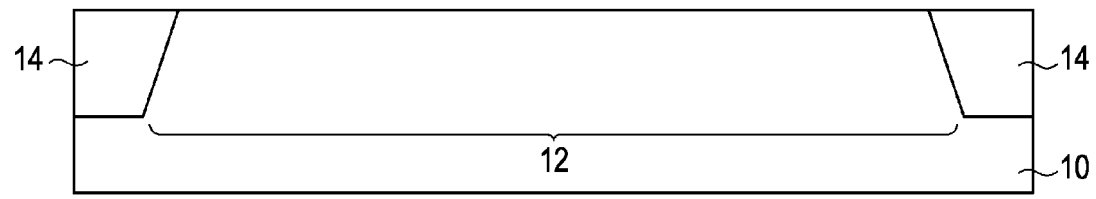
FIGS. 8A and 8B are process diagrams (part 1) showing a method of manufacturing a semiconductor storage device according to the first embodiment.
Figure 8B:
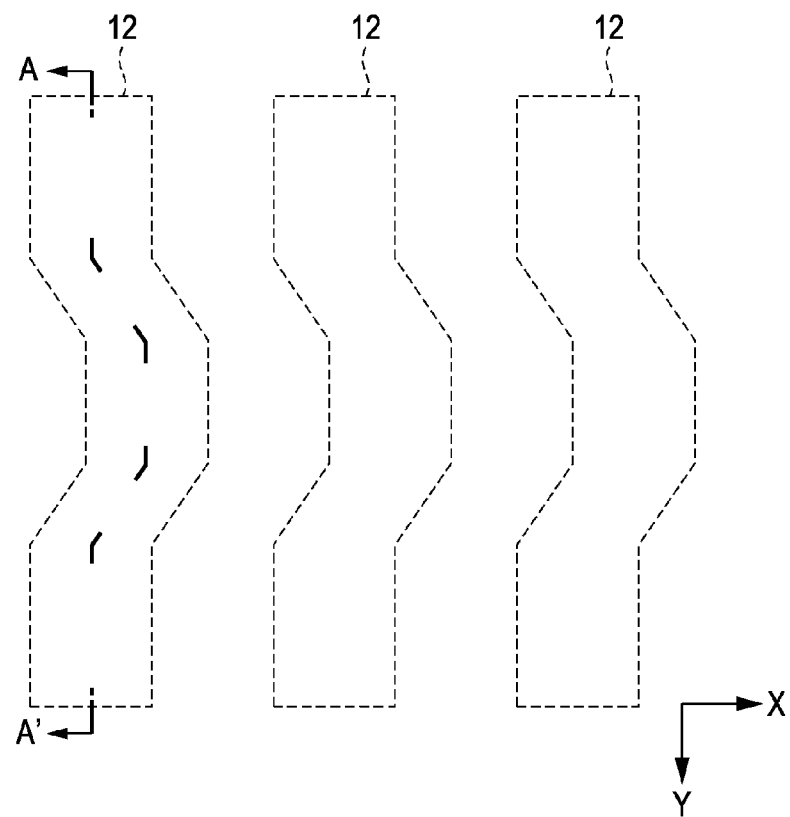
Figure 9A:
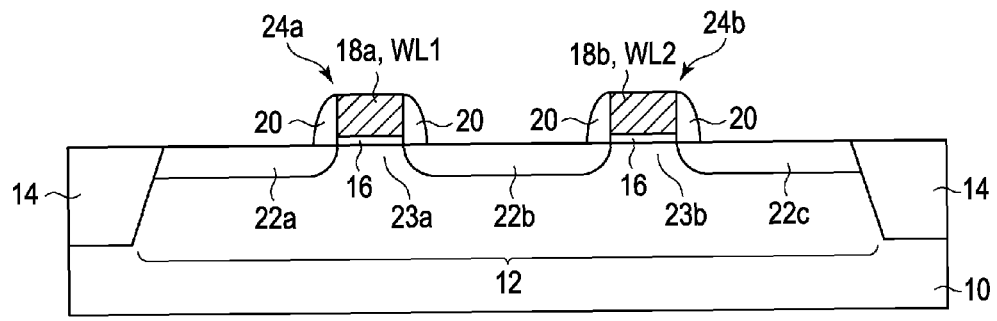
FIGS. 9A and 9B are process diagrams (part 2) showing the method of manufacturing a semiconductor storage device according to the first embodiment.
Figure 9B:
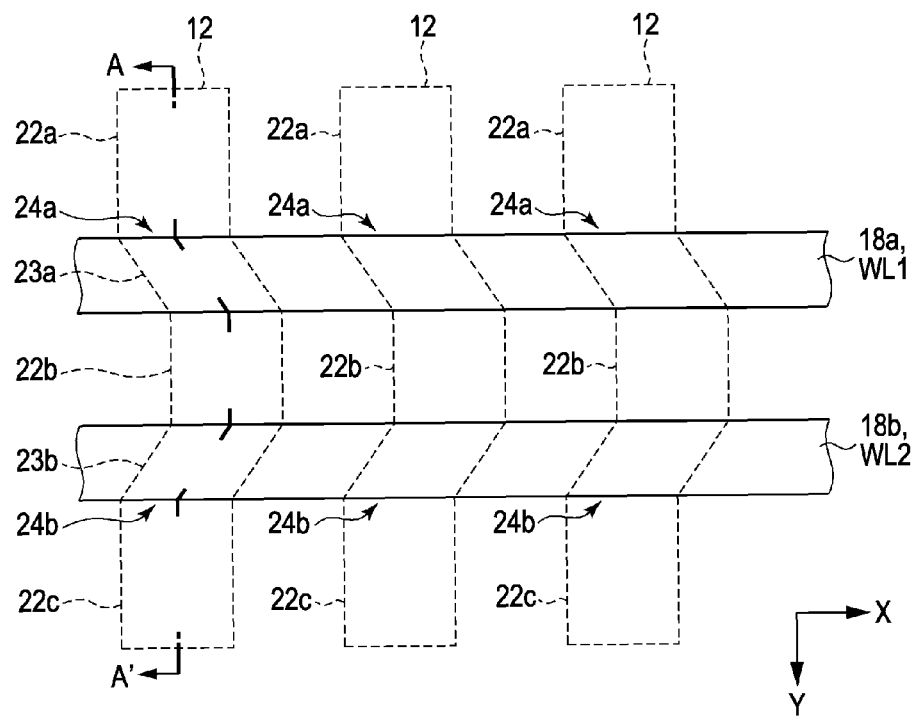
Figure 10A:
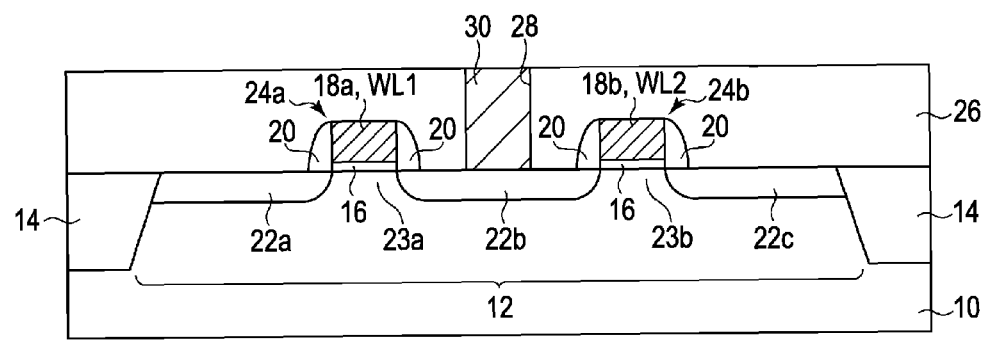
FIGS. 10A and 10B are process diagrams (part 3) showing the method of manufacturing a semiconductor storage device according to the first embodiment.
Figure 10B:
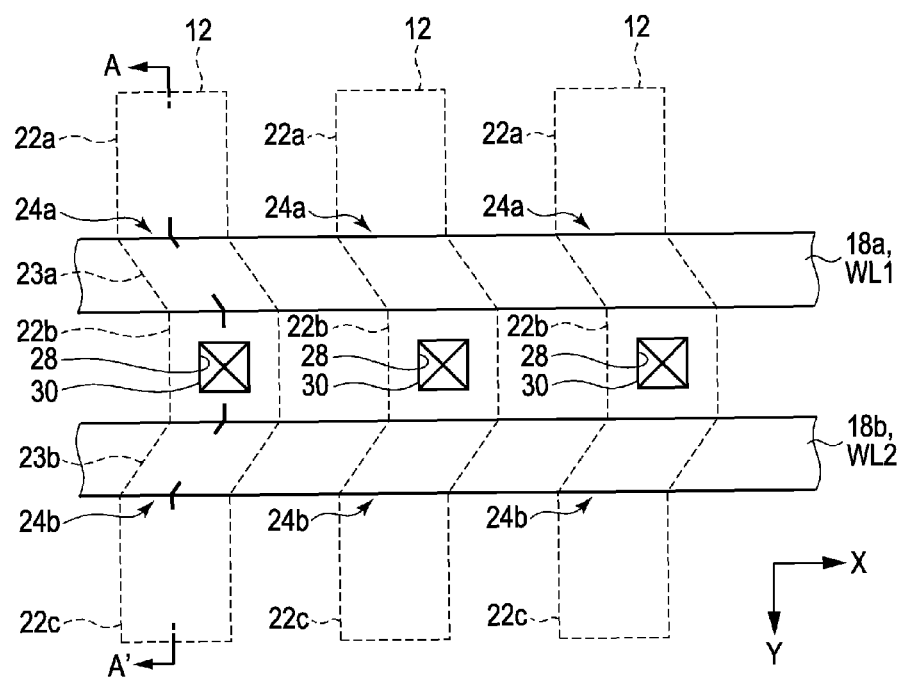
Figure 11A:
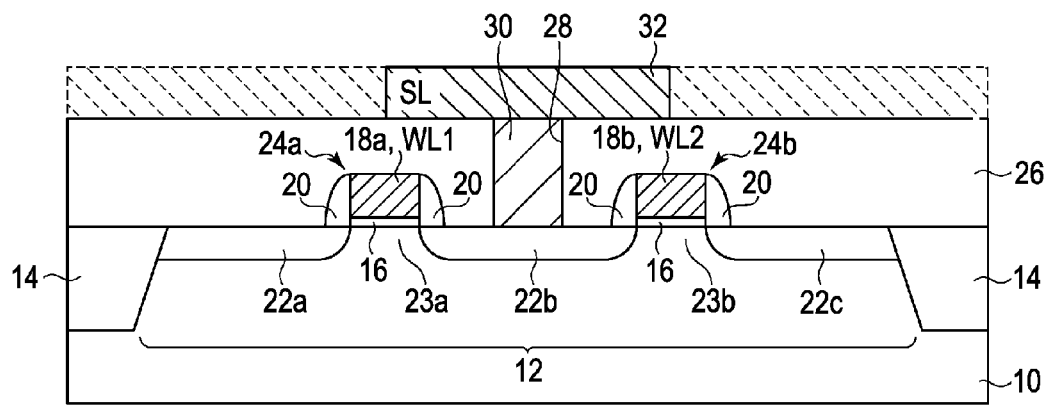
FIGS. 11A and 11B are process diagrams (part 4) showing the method of manufacturing a semiconductor storage device according to the first embodiment.
Figure 11B:
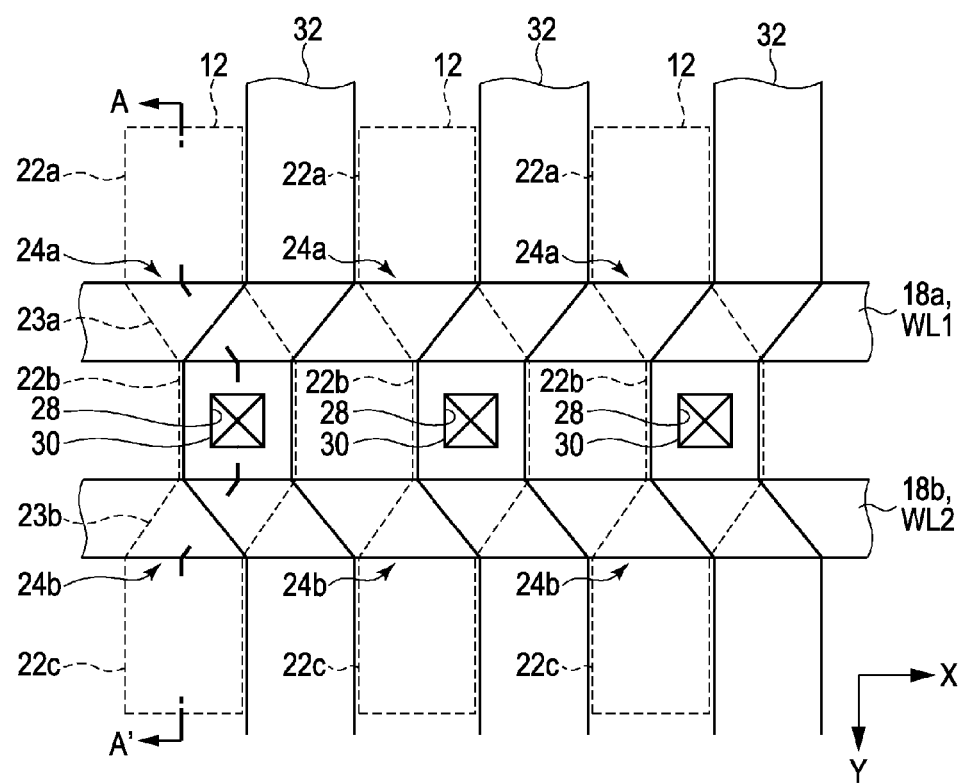
Figure 12A:
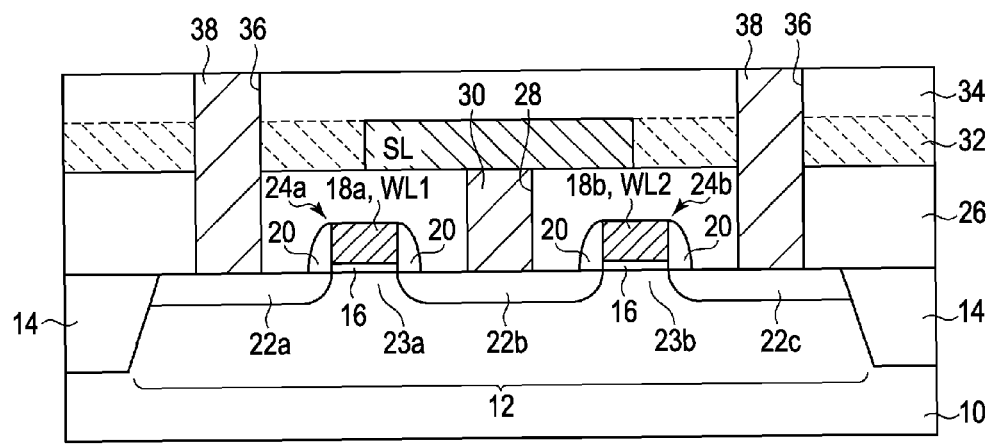
FIGS. 12A and 12B are process diagrams (part 5) showing the method of manufacturing a semiconductor storage device according to the first embodiment.
Figure 12B:
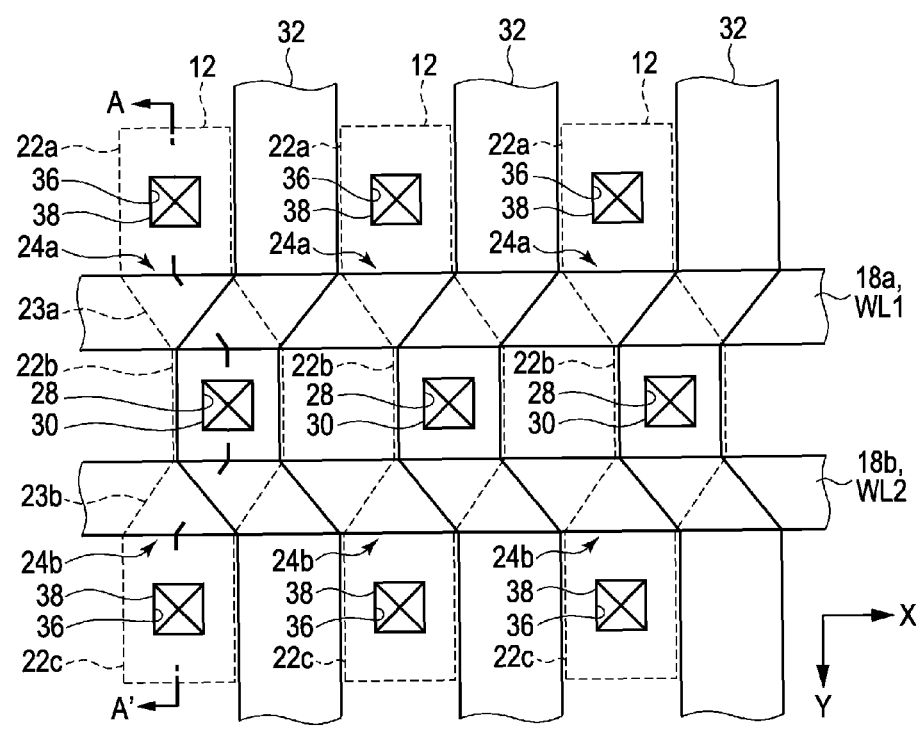

As shown in FIGS. 8A and 8B, for example, on the semiconductor substrate 10 constituted by, for example, a silicon substrate, the element isolation region 14 which lays out the element region (active region) 12 is formed. When the element isolation region 14 is formed, the element isolation region 14 is formed such that the region in which the source region 22b is formed is deviated in the X direction with reference to the region in which the first drain region 22a is formed and the region in which the second drain region 22c is formed.

A gate insulating film 16 is formed on the entire surface by a thermal oxidation method.

A polysilicon film is formed on the entire surface by a CVD method.

The polysilicon film is patterned by using a photolithography technique. By this, the first word line WL1 including the gate electrode 18a of the first transistor 24a is formed. The second word line WL2 including the gate electrode 18b of the second transistor 24b is formed. The first word line WL1 and the second word line WL2 are formed to extend in the X direction.

By using the first gate electrode 18a and the second gate electrode 18b as masks, a dopant impurity is doped in the element region 12. In this manner, the first drain region 22a is formed in the element region 12 on one side of the first gate electrode 18a of the first transistor 24a. The source region 22b is formed in the element region 12 on the other side of the second gate electrode 18b of the second transistor 24b. The second drain region 22c is formed in the element region 12 on the other side of the gate electrode 18b of the second transistor 24b. The source region 22b serves as the source region 22b of the first transistor 24a and the source region 22b of the second transistor 24b (see FIGS. 9A and 9B).

The insulating interlayer 26 constituted by a silicon oxide film is formed on the entire surface by, for example, a CVD method.

The surface of the insulating interlayer 26 is planarized by a CMP (Chemical Mechanical Polishing) method.

A contact hole reaching the source region 22b is formed.

A barrier metal (not shown) is formed on the entire surface by, for example, a sputtering method.

A tungsten film is formed on the entire surface by, for example, a CVD method.

The tungsten film and the barrier metal are polished by, for example, a CMP method until the surface of the insulating interlayer 26 is exposed. In this manner, the conductor plug 30 consisting of tungsten is buried in the contact hole 28 (see FIGS. 10A and 10B).

An aluminum film is formed by, for example, a sputtering method.

The aluminum film is patterned by using a photolithography technique. By this, the source line 32 consisting of aluminum is formed. When the source line 32 is formed, on a region between the first word line WL1 and the second word line WL2, the source line 32 is formed such that the source line 32 is deviated in a direction opposing the X direction. More specifically, the source line 32 is formed such that a part of the source line 32 overlaps with the source region 22b on the region between the first word line WL1 and the second word line WL2. The source line 32 is electrically connected to the source region 22b through the conductor plug 30 (see FIGS. 11A and 11B).

An insulating interlayer 34 constituted by a silicon oxide film is formed on the entire surface by, for example, a CVD method.

The surface of the insulating interlayer 34 is planarized by, for example, a CMP method.

The contact hole 36 reaching the first drain region 22a of the first transistor 24a and the contact hole 36 reaching the second drain region 22c of the second transistor 24b are formed in the insulating interlayers 26 and 34 by a photolithography technique.

A barrier metal is formed on the entire surface by, for example, a sputtering method.

A tungsten film is formed on the entire surface by, for example, a CVD method.

The tungsten film and the barrier metal are polished by, for example, a CMP method until the surface of the insulating interlayer 34 is exposed. In this manner, the conductor plug 38 consisting of tungsten is buried in the contact hole 36 (see FIGS. 12A and 12B).

The underlying layer 42 constituted by a Ta film having a film thickness of, for example, 10 nm is formed by, for example, a sputtering method. The underlying layer 42 serves as an underlying electrode of each of the magnetoresistive effect elements 40a and 40b. A pressure in a film forming chamber is set to, for example, about $1 \times 10^{-7}$ Torr. As a sputtering gas, for example, an Ar gas is used. A film forming temperature is set to, for example, room temperature.

The antiferromagnetic layer 44 constituted by a PtMn film having a film thickness of, for example, 15 nm is formed on the entire surface by, for example, a sputtering method. A pressure in a film forming chamber is set to, for example, about $1 \times 10^{-7}$ Torr. As a sputtering gas, for example, an Ar gas is used. A film forming temperature is set to, for example, room temperature.

An antiferromagnetic layer 46 constituted by a CoFe film having a film thickness of, for example, 1.7 nm is formed on the entire surface by, for example, a sputtering method. A pressure in a film forming chamber is set to, for example, about $1 \times 10^{-7}$ Torr. As a sputtering gas, for example, an Ar gas is used. A film forming temperature is set to, for example, room temperature.

An antiferromagnetic layer 48 constituted by an Ru film having a film thickness of, for example, 0.68 nm is formed on the entire surface by, for example, a sputtering method. A pressure in a film forming chamber is set to, for example, about $1 \times 10^{-7}$ Torr. As a sputtering gas, for example, an Ar gas is used. A film forming temperature is set to, for example, room temperature.

An antiferromagnetic layer 50 constituted by a CoFeB film having a film thickness of, for example, 2.2 nm is formed on the entire surface by, for example, a sputtering method. A pressure in a film forming chamber is set to, for example, about $1 \times 10^{-7}$ Torr. As a sputtering gas, for example, an Ar gas is used. A film forming temperature is set to, for example, room temperature.

The ferromagnetic film constituted by a CoFe film (CoFe film 46), the ferromagnetic film constituted by an Ru film (Ru film 48), and the ferromagnetic film constituted by a CoFeB film (CoFeB film 50) form the magnetization fixing layer (pinned layer) 52. A pressure in a film forming chamber is set to, for example, about $1 \times 10^{-7}$ Torr. As a sputtering gas, for example, an Ar gas is used. A film forming temperature is set to, for example, room temperature.

The tunnel barrier layer 54 constituted by an MgO film having a film thickness of, for example, 1.2 nm is formed on the entire surface by, for example, a sputtering method. A pressure in a film forming chamber is set to, for example, about $1 \times 10^{-7}$ Torr. As a sputtering gas, for example, an Ar gas is used. A film forming temperature is set to, for example, room temperature.

The magnetization free layer 56 constituted by a CoFeB film having a film thickness of, for example, 2 nm is formed on the entire surface by, for example, a sputtering method. A pressure in a film forming chamber is set to, for example, about $1 \times 10^{-7}$ Torr. As a sputtering gas, for example, an Ar gas is used. A film forming temperature is set to, for example, room temperature. This is the way the magnetization free layer 56 is formed.

Another antiferromagnetic film constituted by an Ru film (the Ru film) having a film thickness of, for example, 10 nm is formed on the entire surface by, for example, a sputtering method. A pressure in a film forming chamber is set to, for example, about $1 \times 10^{-7}$ Torr. As a sputtering gas, for example, an Ar gas is used. A film forming temperature is set to, for example, room temperature.

The Ta film 60 having a film thickness of, for example, a film thickness of 30 nm is formed by, for example, a sputtering method. A pressure in a film forming chamber is set to, for example, about $1 \times 10^{-7}$ Torr. As a sputtering gas, for example, an Ar gas is used. A film forming temperature is set to, for example, room temperature.

Figure 13:
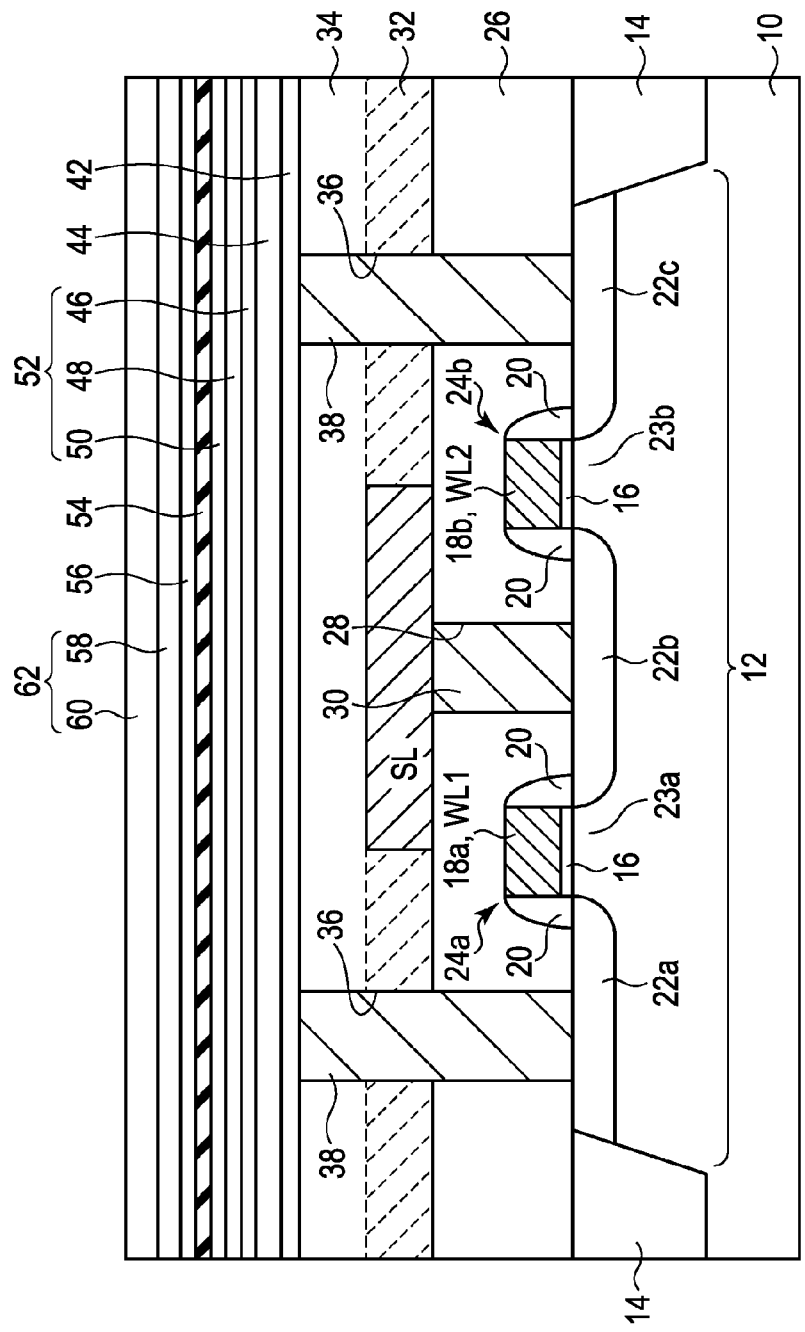
FIG. 13 is a process diagram (part 6) showing a method of manufacturing the semiconductor storage device according to the first embodiment.
Figure 14A:
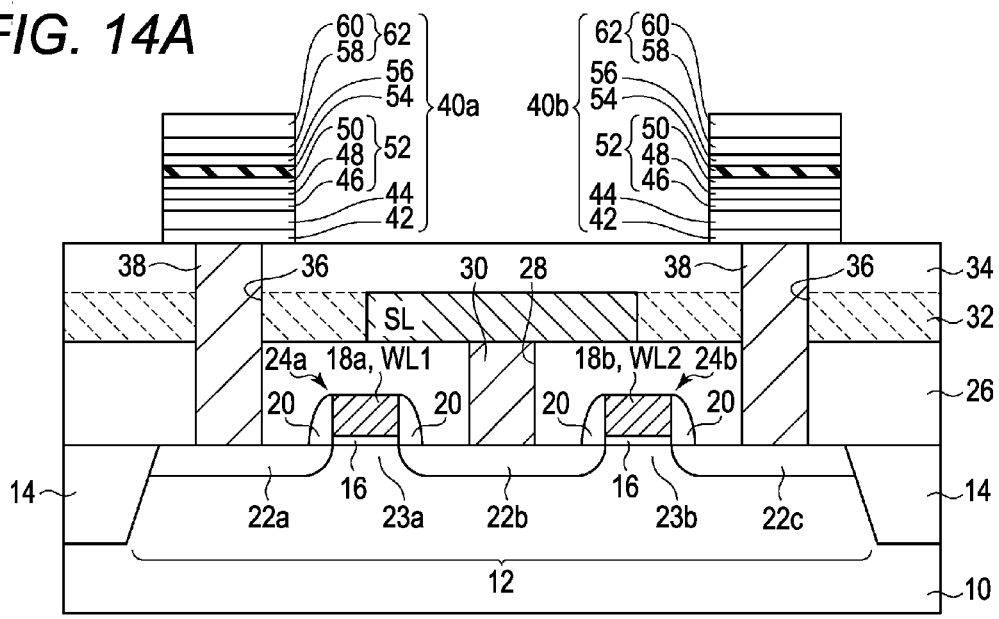
FIGS. 14A and 14B are process diagrams (part 7) showing the method of manufacturing a semiconductor storage device according to the first embodiment.
Figure 14B:
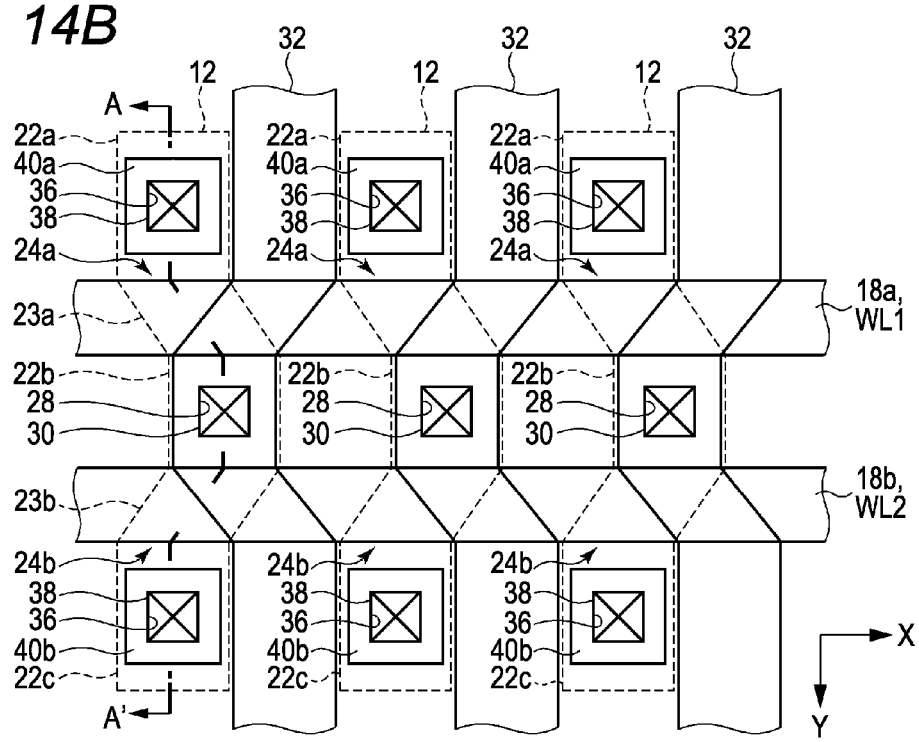
Figure 15A:
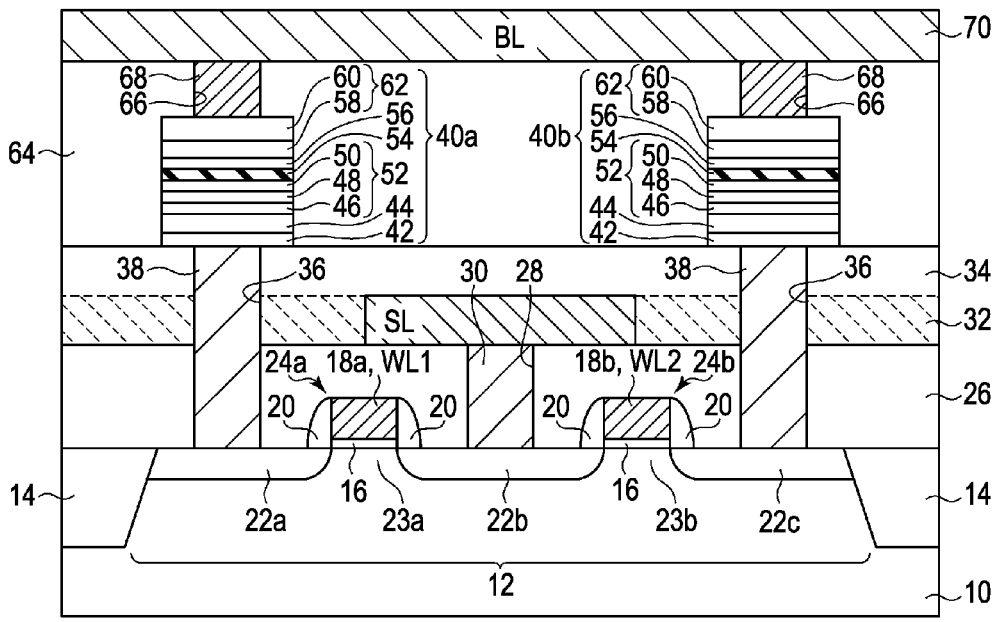
FIGS. 15A and 15B are process diagrams (part 8) showing the method of manufacturing a semiconductor storage device according to the first embodiment.
Figure 15B:
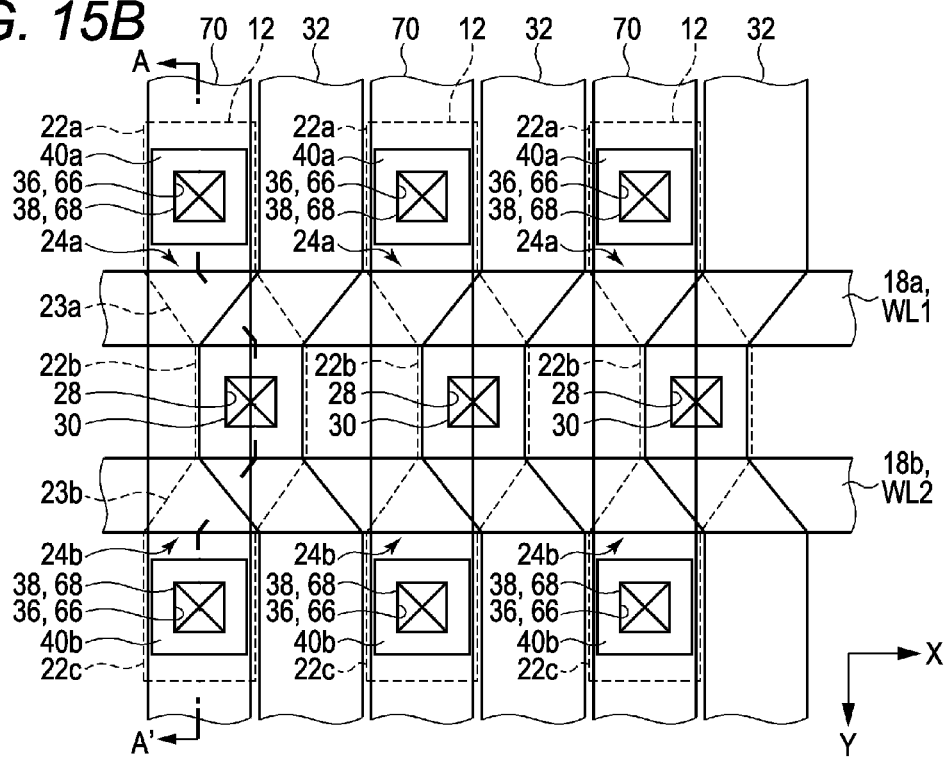

The cap layer 62 constituted by a laminated film including the Ru film 58 and the Ta film 60 is formed (see FIG. 13).

A photoresist film is formed on the entire surface by a spin coating method.

The photoresist film is patterned by using a photolithography technique. In this manner, a photoresist film having a planar shape of the magnetoresistive effect elements 40a and 40b is formed.

By using the photoresist film as a mask, the Ta film 60 is etched by an RIE (Reactive Ion Etching) method. As an etching gas, a gas mixture of a $CF_4$ gas and an Ar gas is used.

By using the photoresist film as a mask, the Ru film 58, the magnetization free layer 56, the tunnel barrier layer 54, the magnetization fixing layer 52, and the antiferromagnetic layer 44 are etched by an RIE method. As an etching gas, a gas mixture of a CO gas and an $NH_3$ gas is used.

By using the photoresist film as a mask, the underlying layer 42 is etched by an RIE method. As an etching gas, a gas mixture of a $CF_4$ gas and an Ar gas is used.

The magnetoresistive effect elements 40a and 40b constituted by the underlying layer 42, the antiferromagnetic layer 44, the magnetization fixing layer 52, the tunnel barrier layer 54, the magnetization free layer 56, and the upper electrode 62 are formed. More specifically, the MTJ elements 40a and 40b are formed (see FIGS. 14A and 14B).

The insulating interlayer 64 constituted by a silicon oxide film is formed on the entire surface by, for example, a CVD method.

The surface of the insulating interlayer 64 is planarized by, for example, a CMP method.

By using a photolithography technique, the contact holes 66 reaching the cap layers (upper electrodes) 62 of the magnetoresistive effect elements 40a and 40b are formed.

A barrier metal (not shown) is formed on the entire surface by, for example, a sputtering method.

A tungsten film is formed on the entire surface by, for example, a CVD method.

The tungsten film and the barrier metal are polished by, for example, a CMP method until the surface of the upper electrode 62 is exposed. In this manner, the conductor plugs 68 consisting of tungsten is buried in the contact hole 66.

An aluminum film is formed by, for example, a sputtering method.

The aluminum film is patterned by a photolithography technique. In this manner, the bit line 70 consisting of aluminum is formed. When the bit line 70 is formed, the bit line 70 is formed to extend in the Y direction. The bit line 70 is connected to the magnetoresistive effect elements 40a and 40b through the conductor plugs 68.

In this manner, the semiconductor storage device according to the present embodiment is manufactured.

In this manner, in the present embodiment, the source line 32 is formed to be adjacent to the first drain region 22a and the second drain region 22c and to overlap with the source region 22b in planar view, and the bit line 70 is formed on a layer higher than the source line 32. More specifically, the source region 22b is deviated in the X direction with reference to the first drain region 22a and the second drain region 22c, and a portion of the source line 32 located on a region between the first word line WL1 and the second word line WL2 is deviated in a direction opposing the X direction. For this reason, the portion deviated in the direction opposing the X direction on the source line 32 and the source region 22b are connected by the conductor plug 30 between the first word line WL1 and the second word line WL2. For this reason, according to the present embodiment, even though both the source line 32 and the bit line 70 are formed to extend in the Y direction, the size of the memory cell 72 in the X direction can be minimized to make it possible to realize miniaturization and high integration density of the semiconductor storage device.

Second Embodiment

Figure 16:
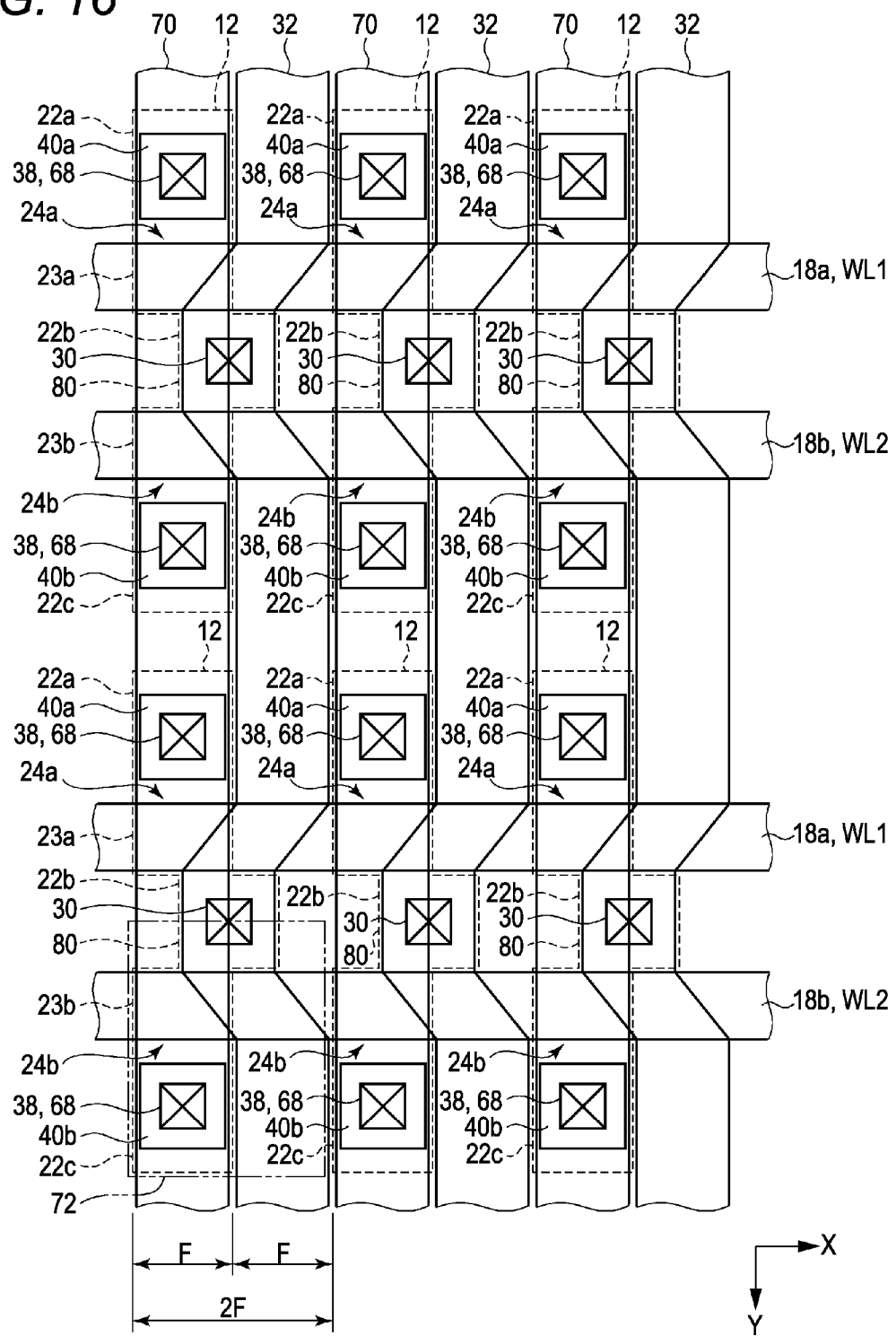
FIG. 16 is a plan view showing a semiconductor storage device according to a second embodiment.

A semiconductor storage device according to a second embodiment will be described below with reference to FIG. 16. FIG. 16 is a plan view showing the semiconductor storage device according to the present embodiment. The same reference numerals as in the semiconductor storage device according to the first embodiment shown in FIG. 1 to FIG. 15B denote the same constituent elements in FIG. 16, a description thereof will be simplified or will not be repeated here.

The semiconductor storage device according to the present embodiment is mainly characterized in that the channel region 23a of the first transistor 24a and the channel region 23b of the second transistor 24b are formed in the Y direction.

As shown in FIG. 16, the channel region 23a of the first transistor 24a is formed in the Y direction. The source region 22b is deviated in the X direction with reference to the first drain region 22a of the first transistor 24a and the second drain region 22c of the second transistor 24b. The channel region 23b of the second transistor 24b is formed in the Y direction.

A width of the first drain region 22a of the first transistor 24a, a width of the channel region 23a of the first transistor 24a, a width of the source region 22b, a width of the channel region 23b of the second transistor 24b, and a width of the second drain region 22c of the second transistor 24b are set to be equal to each other.

In the element region 12, a notched portion (recessed portion) 80 is formed on a region between the first word line WL1 and the second word line WL2. In the present embodiment, the notched portion 80 is formed in the element region 12 to reduce the size of the memory cell 72 in the X direction while securing a minimum processing size F as an interval between the element regions 12 adjacent to each other in the X direction.

A portion of the source line 32 located on the first word line WL1 is formed to be oblique with reference to the Y direction. A portion of the source line 32 located on the region between the first word line WL1 and the second word line WL2 is deviated in a direction opposing the X direction. A portion of the source line 32 located on the second word line WL2 is formed to be oblique with reference to the Y direction. More specifically, in the present embodiment, the source line 32 is bent such that the portion on the region between the first word line WL1 and the second word line WL2 on the source line 32 is deviated in the direction opposing the X direction. The source line 32 overlaps with the source region 22b in the region between the first word line WL1 and the second word line WL2 in planar view.

The portion of the source line 32 located on the region between the first word line WL1 and the second word line WL2 and the source region 22b are connected to each other by the conductor plug 30.

In FIG. 16, a portion surrounded by a chain double-dashed line indicates a size of one memory cell 72. When the minimum processing size of the source line 32 or the bit line 70 is represented by F, in the present embodiment, the size of one memory cell 72 in the X direction is given by 2 F. In this manner, even in the present embodiment, the size of the memory cell can be extremely reduced.

As described above, the semiconductor storage device according to the present embodiment is configured.

In this manner, in the present embodiment, the source line 32 is adjacent to the first drain region 22a and the second drain region 22c, and is formed to overlap with the source region 22b in planar view. The bit line 70 is formed on a layer higher than the source line 32. For this reason, the portion of the source line 32 deviated in the direction opposing the X direction and the source region 22b are connected to each other by the conductor plug 30 between the first word line WL1 and the second word line WL2.

For this reason, according to the present embodiment, even though both the source line 32 and the bit line 70 are formed to extend in the Y direction, the size of the memory cell 72 in the X direction can be extremely reduced. Miniaturization and high integration density of the semiconductor storage device can be realized.

Third Embodiment

Figure 17:
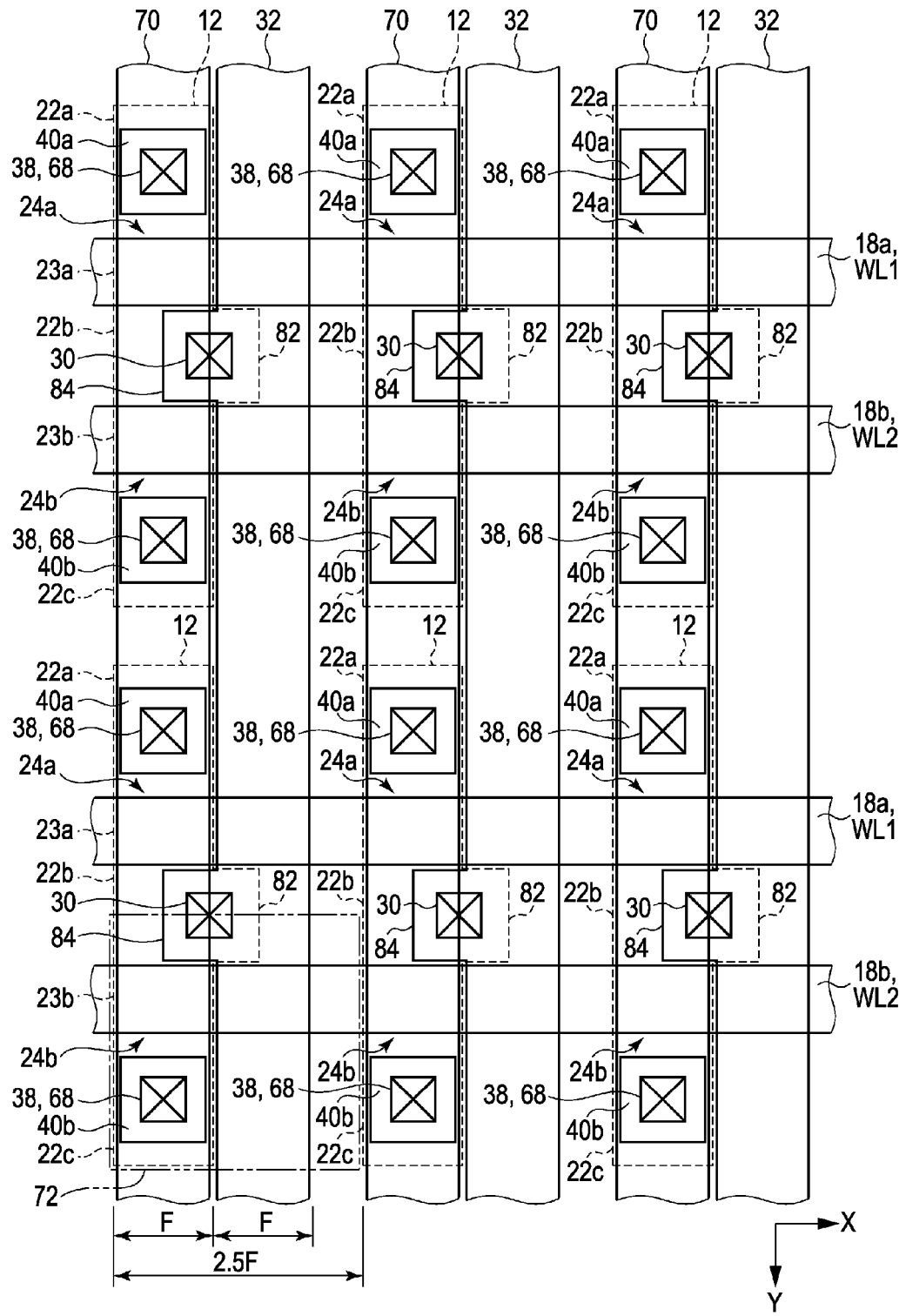
FIG. 17 is a plan view showing a semiconductor storage device according to a third embodiment.

A semiconductor storage device according to a third embodiment will be described below with reference to FIG. 17. FIG. 17 is a plan view showing the semiconductor storage device according to the present embodiment. The same reference numerals as in the semiconductor storage device according to the first or second embodiment shown in FIGS. 1 to 16 denote the same constituent elements in FIG. 17, thus a description thereof will be simplified or will not be repeated here.

The semiconductor storage device according to the present embodiment is mainly characterized in that the source region 22b projects in the X direction with reference to the first drain region 22a and the second drain region 22c, and a part of the source line 32 projects in a direction opposing the X direction on a region between the first word line WL1 and the second word line WL2.

As shown in FIG. 17, the source region 22b has a projection portion 82 projecting in the X direction between the first word line WL1 and the second word line WL2. A size of the projection portion 82 in the source region 22b is given by F/2 when a minimum processing size of the source line 32 or the bit line 70 is represented by F. A width of the source region 22b is larger than a width of the first drain region 22a of the first transistor 24a, and a width of the source region 22b is larger than a width of the second drain region 22c of the second transistor 24b. In the present embodiment, the notched portion (recessed portion) 80 as shown in FIG. 16 is not formed in the element region 12.

The source line 32 has a projection portion 84 projecting in a direction opposing the X direction on a region between the first word line WL1 and the second word line WL2. A size of the projection portion 84 of the source line 32 in the X direction is given by F/2 when a minimum processing size of the source line 32 or the bit line 70 is represented by F. A width of the source line 32 on the region between the first word line WL1 and the second word line WL2 is larger than a width of the source line 32 on a region adjacent to the first drain region 22a of the first transistor 24a. A width of the source line 32 on the region between the first word line WL1 and the second word line WL2 is larger than a width of the source line 32 on a region adjacent to the second drain region 22c of the second transistor 24b.

A portion of the element region 12 including the projection portion 82 and a portion of the source line 32 including the projection portion 84 are connected to each other by the conductor plug 30.

In FIG. 17, a portion surrounded by a chain double-dashed line indicates a size of one memory cell 72. When the minimum processing size of the source line 32 or the bit line 70 is represented by F, in the present embodiment, the size of one memory cell 72 in the X direction is given by 2.5 F. In this manner, even in the present embodiment, the size of the memory cell 72 can be made relatively small.

As described above, the semiconductor storage device according to the present embodiment is configured.

In this manner, in the present embodiment, the source region 22b projects in the X direction with reference to the first drain region 22a and the second drain region 22c. The source line 32 projects in a direction opposing the X direction on a region between the first word line WL1 and the second word line WL2. For this reason, in the present embodiment, a portion of the source region 22b including the projection portion 82 and a portion of the source line 32 including the projection portion 84 are connected to each other by the conductor plug 30 between the first word line WL1 and the second word line WL2. For this reason, even in the present embodiment, the size of the memory cell 72 in the X direction can be made relatively small, and miniaturization and high integration density of the semiconductor storage device can be realized.

Fourth Embodiment

Figure 18:
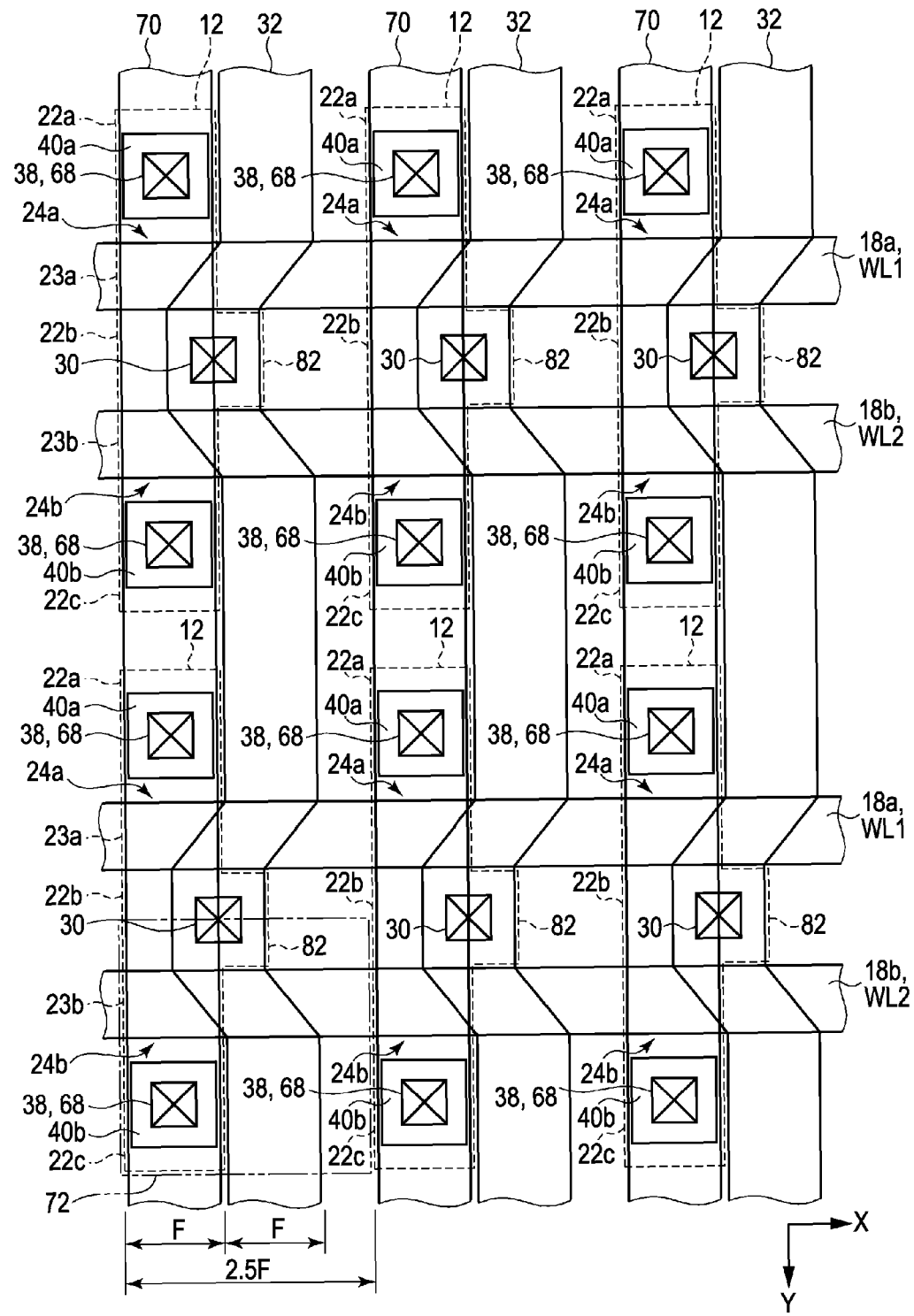
FIG. 18 is a plan view showing a semiconductor storage device according to a fourth embodiment.

A semiconductor storage device according to a fourth embodiment will be described below with reference to FIG. 18. FIG. 18 is a plan view of the semiconductor storage device according to the present embodiment. The same reference numerals as in the semiconductor storage devices according to the first to third embodiments shown in FIGS. 1 to 17 denote the same constituent elements in FIG. 18, thus a description thereof will be simplified or will not be repeated here.

The semiconductor storage device according to the present embodiment is mainly characterized in that the source region 22b projects in the X direction with reference to the first drain region 22a and the second drain region 22c, and a part of the source line 32 is deviated in a direction opposing the X direction on a region between the first word line WL1 and the second word line WL2.

As shown in FIG. 18, the source region 22b has the projection portion 82 projecting in the X direction with reference to the first drain region 22a of the first transistor 24a and the second drain region 22c of the second transistor 24b. A size of the projection portion 82 of the source region 22b is given by F/2 when a minimum processing size of the source line 32 or the bit line 70 is represented by F.

A portion of the source line 32 located on the first word line WL1 is formed to be oblique with reference to the Y direction. A portion of the source line 32 located on the region between the first word line WL1 and the second word line WL2 is deviated in a direction opposing the X direction. A portion of the source line 32 located on the second word line WL2 is formed to be oblique with reference to the Y direction. In this manner, in the present embodiment, the source line 32 is bent such that a portion of the source line 32 located on the region between the first word line WL1 and the second word line WL2 is deviated in the direction opposing the X direction.

A portion of the source region 22b including the projection portion 82 and the portion of the source line 32 deviated in the direction opposing the X direction are connected to each other by the conductor plug 30.

In FIG. 18, a portion surrounded by a chain double-dashed line indicates a size of one memory cell 72. When the minimum processing size of the source line 32 or the bit line 70 is represented by F, in the present embodiment, the size of one memory cell 72 in the X direction is given by 2.5 F. In this manner, in the present embodiment also, the size of the memory cell 72 can be made relatively small.

As described above, the semiconductor storage device according to the present embodiment is configured.

In this manner, in the present embodiment, the element region 12 has the projection portion 82 projecting in the X direction between the first word line WL1 and the second word line WL2, and the source line 32 is deviated in a direction opposing the X direction on the region between the first word line WL1 and the second word line WL2. For this reason, according to the present embodiment, the projection portion 82 in the element region 12a and the portion of the source line 32 deviated in the direction opposing the X direction are connected to each other by the conductor plug 30 between the first word line WL1 and the second word line WL2. For this reason, in the present embodiment, the size of the memory cell in the X direction can be made relatively small, and miniaturization and high integration density of the semiconductor storage device can be realized.

Fifth Embodiment

Figure 19:
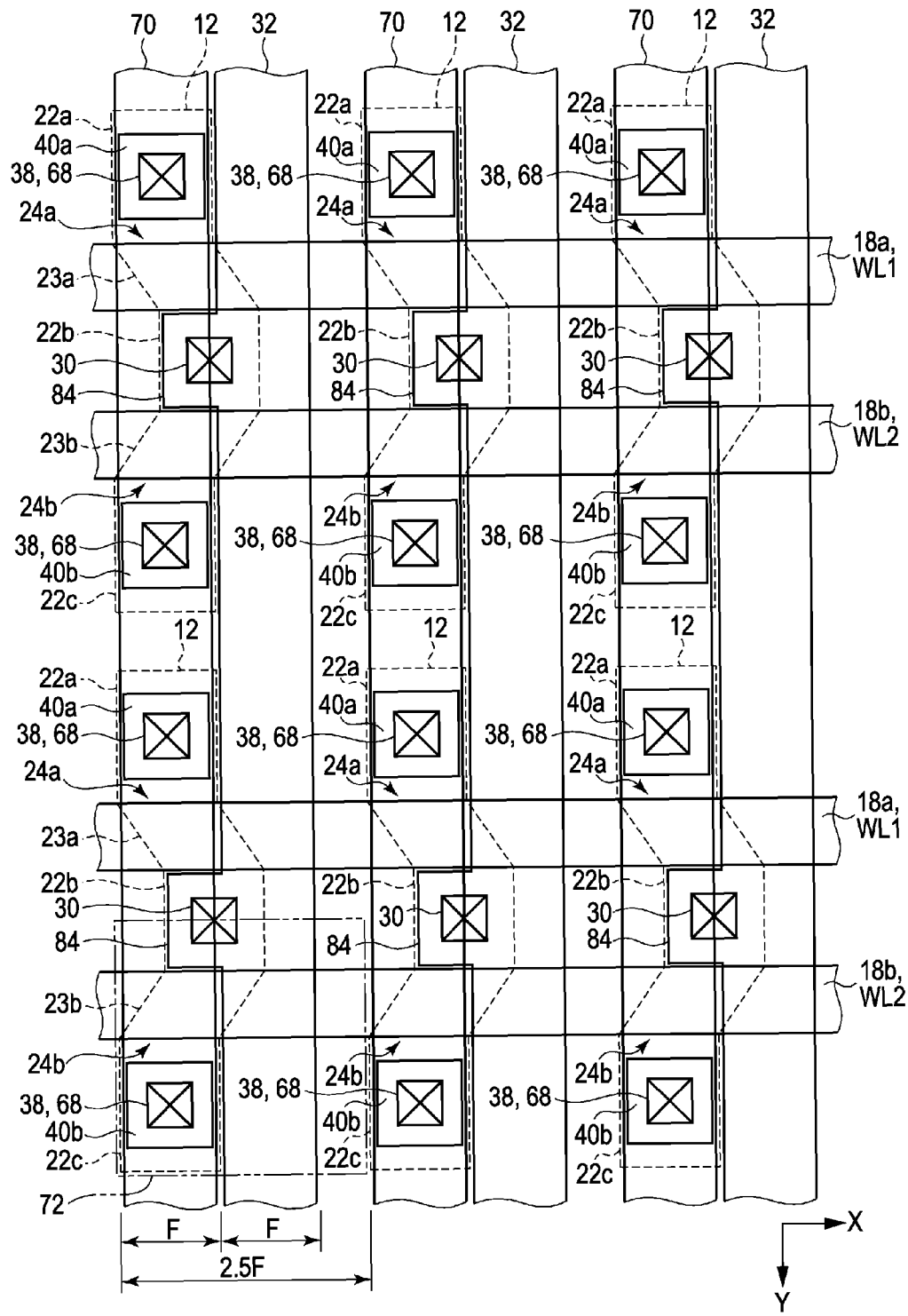
FIG. 19 is a plan view showing a semiconductor storage device according to a fifth embodiment.

A semiconductor storage device according to a fifth embodiment will be described below with reference to FIG. 19. FIG. 19 is a plan view showing the semiconductor storage device according to the present embodiment. The same reference numerals as in the semiconductor storage devices according to the first to fourth embodiments shown in FIGS. 1 to 18 denote the same constituent elements in FIG. 19, thus a description thereof will be simplified or will not be repeated here.

The semiconductor storage device according to the present embodiment is mainly characterized in that the source region 22b is deviated in the X direction with reference to the first drain region 22a and the second drain region 22c, and a part of the source line 32 is deviated in a direction opposing the X direction on a region between the first word line WL1 and the second word line WL2.

As shown in FIG. 19, the channel region 23a of the first transistor 24a is formed to be oblique with reference to the Y direction. The source region 22b is deviated with reference to the first drain region 22a of the first transistor 24a and the second drain region 22c of the second transistor 24b. The channel region 23b of the second transistor 24b is formed to be oblique with reference to the Y direction. In this manner, in the present embodiment, the element region 12 is bent such that the source region 22b is deviated in the X direction with reference to the first drain region 22a and the second drain region 22c.

The source line 32 has the projection portion 84 projecting in a direction opposing the X direction on the region between the first word line WL1 and the second word line WL2.

A portion of the source line 32 including the projection portion 84 and the source region 22b are connected to each other by the conductor plug 30.

In FIG. 19, a portion surrounded by a chain double-dashed line indicates a size of one memory cell 72. When the minimum processing size of the source line 32 or the bit line 70 is represented by F, in the present embodiment, the size of one memory cell 72 in the X direction is given by 2.5 F. In this manner, in the present embodiment also, the size of the memory cell can be made relatively small.

As described above, the semiconductor storage device according to the present embodiment is configured.

In this manner, in the present embodiment, the source region 22b is deviated in the X direction with reference to the first drain region 22a and the second drain region 22c, and the source line 32 has the projection portion 84 projecting in a direction opposing the X direction on a region between the first word line WL1 and the second word line WL2. For this reason, according to the present embodiment, a portion of the source line 32 including the projection portion 84 and the source region 22b are connected to each other by the conductor plug 30 between the first word line WL1 and the second word line WL2. For this reason, in the present embodiment, the size of the memory cell 72 in the X direction can be made relatively small, and miniaturization and high integration density of the semiconductor storage device can be realized.

Sixth Embodiment

Figure 20:
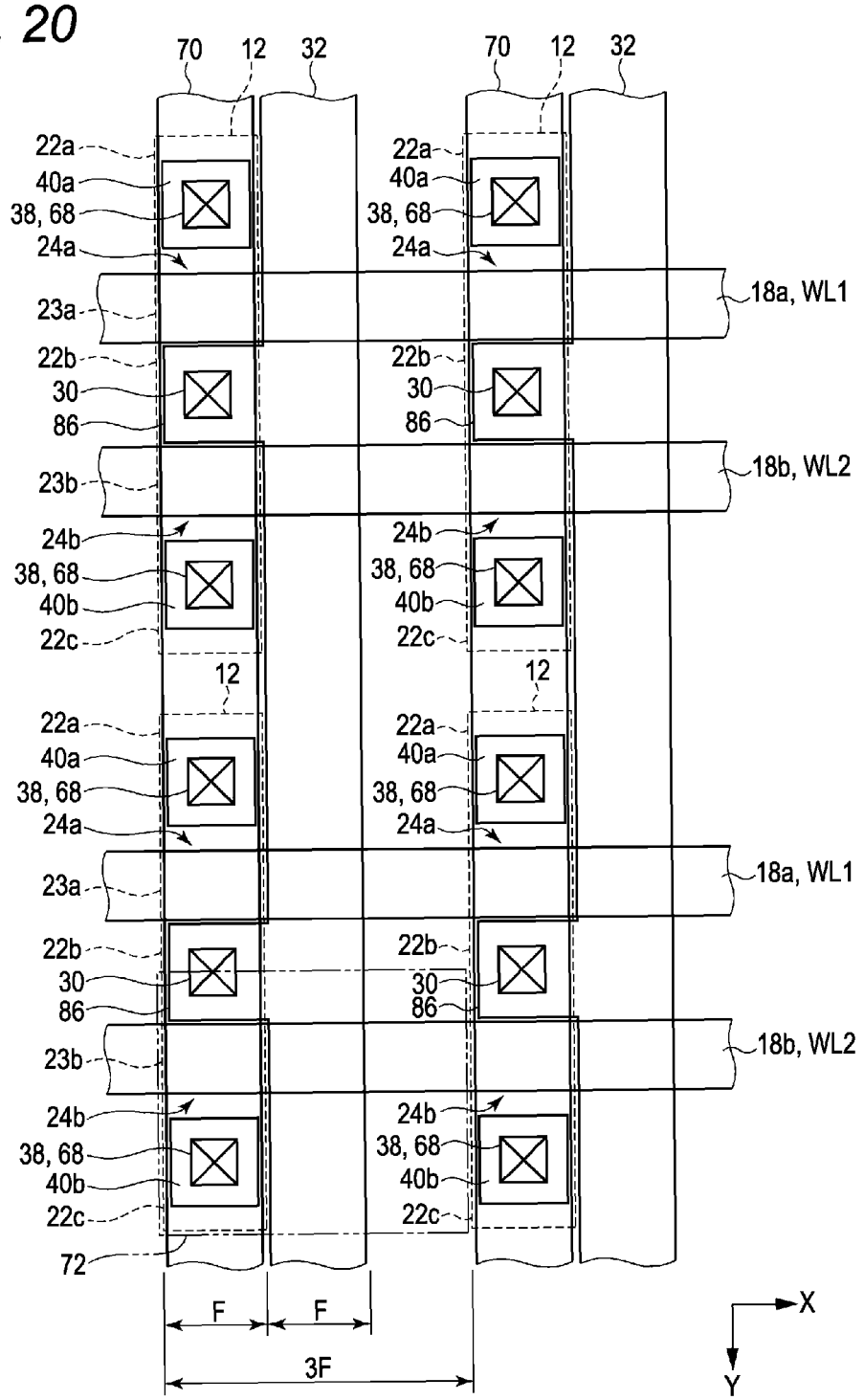
FIG. 20 is a plan view showing a semiconductor storage device according to a sixth embodiment.

A semiconductor storage device according to a sixth embodiment will be described below with reference to FIG. 20. FIG. 20 is a plan view of the semiconductor storage device according to the present embodiment. The same reference numerals as in the semiconductor storage devices according to the first to fifth embodiments shown in FIGS. 1 to 19 denote the same constituent elements in FIG. 20, thus a description thereof will be simplified or will not be repeated here.

The semiconductor storage device according to the present embodiment is mainly characterized in that the element region 12 is linearly formed to extend in the Y direction, and a part of the source line 32 largely projects in a direction opposing the X direction on a region between the first word line WL1 and the second word line WL2.

As shown in FIG. 20, the element region 12 is linearly formed to extend in the Y direction. More specifically, a planar shape of the element region 12 is rectangular. The source region 22b does not have the projection portion 82 as shown in FIG. 17. In the present embodiment, the source region 22b is not deviated in the X direction with reference to the first drain region 22a and the second drain region 22c.

The source line 32 has a projection portion 86 largely projecting in a direction opposing the X direction on a region between the first word line WL1 and the second word line WL2. When a minimum processing size of each of the source line 32 and the bit line 70 is represented by F, a size of the projection portion 86 in the X direction is given by F.

The source region 22b and the projection portion 84 on the source line 32 are connected to each other through the conductor plug 30. The center of the conductor plug 30 is located on a straight line which connects the center of the conductor plug 38 connected to the first drain region 22a of the first transistor 24a and the center of the conductor plug 38 connected to the second drain region 22c of the second transistor 24b.

In FIG. 20, a portion surrounded by a chain double-dashed line indicates a size of one memory cell 72. When the minimum processing size of the source line 32 or the bit line 70 is represented by F, in the present embodiment, the size of one memory cell 72 in the X direction is given by 3 F. In this manner, in the present embodiment also, the size of the memory cell 72 in the X direction can be made relatively small.

As described above, the semiconductor storage device according to the present embodiment is configured.

In this manner, in the present embodiment, the source line 32 has the projection portion 86 largely projecting in the direction opposing the X direction on the region between the first word line WL1 and the second word line WL2. For this reason, according to the present embodiment, the projection portion 86 of the source line 32 and the source region 22b are connected to each other by the conductor plug 30 between the first word line WL1 and the second word line WL2. For this reason, in the present embodiment also, a size of the memory cell 72 in the X direction can be made relatively small, and miniaturization and high integration density of the semiconductor storage device can be realized.

Seventh Embodiment

Figure 21:
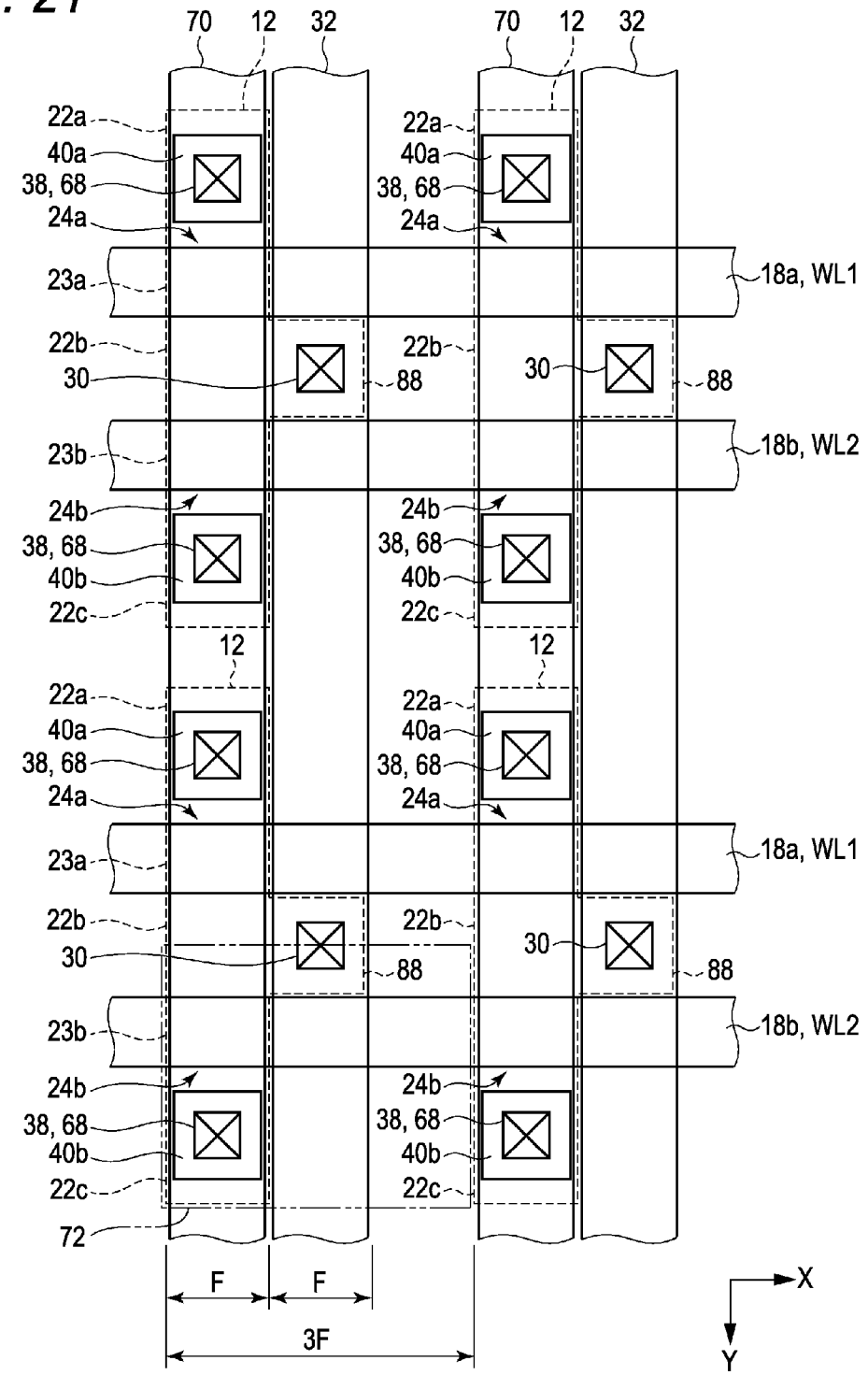
FIG. 21 is a plan view showing a semiconductor storage device according to a seventh embodiment.

A semiconductor storage device according to a seventh embodiment will be described below with reference to FIG. 20. FIG. 21 is a plan view showing the semiconductor storage device according to the present embodiment. The same reference numerals as in the semiconductor storage devices according to the first to sixth embodiments shown in FIGS. 1 to 20 denote the same constituent elements in FIG. 20, thus a description thereof will be simplified or will not be repeated here.

The semiconductor storage device according to the present embodiment is mainly characterized in that the source line 32 is linearly formed to extend in the Y direction, and the element region 12 largely projects in a direction opposing the X direction between the first word line WL1 and the second word line WL2.

As shown in FIG. 21, the source region 22b has a projection portion 88 largely projecting in the X direction with reference to the first drain region 22a of the first transistor 24a and the second drain region 22c of the second transistor 24b. When a minimum processing size of the source line 32 or the bit line 70 is represented by F, a size of the projection portion 88 in the X direction is given by F.

The source line 32 is linearly formed to extend in the Y direction. The projection portion 84 as shown in FIG. 17 is not formed on the source line 32. In the present embodiment, the source line 32 does not have a portion deviated in a direction opposing the X direction.

The projection portion 88 in the element region 12 and a portion of the source line 32 located between the first word line WL1 and the second word line WL2 are connected to each other through the conductor plug 30. The center of the conductor plug 30 is located on a longitudinal center line of the source line 32.

In FIG. 21, a portion surrounded by a chain double-dashed line indicates a size of one memory cell 72. When the minimum processing size of the source line 32 or the bit line 70 is represented by F, in the present embodiment, the size of one memory cell 72 in the X direction is given by 3 F. In this manner, in the present embodiment also, the size of the memory cell 72 in the X direction can be made relatively small.

As described above, the semiconductor storage device according to the present embodiment is configured.

In this manner, in the present embodiment, the source region 22b has the projection portion 88 largely projecting in the X direction with reference to the first drain region 22a and the second drain region 22c. For this reason, according to the present embodiment, the projection portion 88 of the source region 22b and the source region 32 are connected to each other by the conductor plug 30 between the first word line WL1 and the second word line WL2. For this reason, even in the present embodiment, a size of the memory cell 72 in the X direction can be made relatively small, and miniaturization and high integration density of the semiconductor storage device can be realized.

Modification

Various modifications of the first to seventh embodiments can be effected.

For example, in the descriptions of the embodiments made above, MTJ elements are used as the magnetoresistive effect elements 40a and 40b. However, the magnetoresistive effect elements 40a and 40b are not limited to the MTJ elements. Any magnetoresistive effect elements can be arbitrarily used.

In the descriptions of the present embodiment, the magnetoresistive effect elements are used as the storage elements 40a and 40b. The storage elements 40a and 40b are not limited to the magnetoresistive effect elements. The principle of the present invention can be applied to all semiconductor storage devices in which source lines and bit lines extend in the same direction.

In the descriptions of the embodiments made above, the source line 32 is formed on a metal wiring layer serving as a first layer, and the bit line 70 is formed on a metal wiring layer serving as a second wiring layer. However, the present invention is not limited to this configuration. For example, the source line 32 may be formed on the metal wiring layer serving as the second or subsequent layer, or the bit line 70 may be formed on a metal wiring layer serving as a third or subsequent layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor storage device comprising:
a source region formed in an element region formed on a semiconductor substrate;
a first drain region formed in the element region on one side of the source region;
a first gate electrode formed on a first channel region between the source region and the first drain region through a first gate insulating film;
a second drain region formed in the element region on the other side of the source region;
a second gate electrode formed in a second channel region between the source region and the second drain region through a second gate electrode insulating film;
a first word line including the first gate electrode and extending in a first direction;
a second word line including the second gate electrode and extending in the first direction;
a source line extending in a second direction intersecting with the first direction, overlapping with the source region in planar view, and connected to the source region through a first conductor plug;
a first magnetoresistive effect element formed above the first drain region and connected to the first drain region through a second conductor plug;
a second magnetoresistive effect element formed above the second drain region and connected to the second drain region through a third conductor plug; and
a bit line formed on a layer higher than the source line, extending in the second direction, connected to the first magnetoresistive effect element through a fourth conductor plug, and connected to the second magnetoresistive effect element through a fifth conductor plug,
wherein the source region includes a first projection portion projecting in the first direction outside of the first drain region and the second drain region,
the source line includes a second projection portion projecting in the first direction toward the first drain region and the second drain region, and
a portion of the source region including the first projection portion and a portion of the source line including the second projection portion are connected to each other by the first conductor plug.

2. A semiconductor storage device comprising:
a source region formed in an element region formed on a semiconductor substrate;
a first drain region formed in the element region on one side of the source region;
a first gate electrode formed on a first channel region between the source region and the first drain region through a first gate insulating film;
a second drain region formed in the element region on the other side of the source region;
a second gate electrode formed in a second channel region between the source region and the second drain region through a second gate insulating film;
a first word line including the first gate electrode and extending in a first direction;
a second word line including the second gate electrode and extending in the first direction;

a source line extending in a second direction intersecting with the first direction, overlapping with the source region in planar view, and connected to the source region through a first conductor plug;

a first magnetoresistive effect element formed above the first drain region and connected to the first drain region through a second conductor plug;

a second magnetoresistive effect element formed above the second drain region and connected to the second drain region through a third conductor plug; and a bit line formed on a layer higher than the source line, extending in the second direction, connected to the first magnetoresistive effect element through a fourth conductor plug, and connected to the second magnetoresistive effect element through a fifth conductor plug, wherein the source region includes a projection portion projecting in the first direction outside of the first drain region and the second drain region, the source line inc] aides a deviated portion deviated in the first direction so as to overlay the source region, and a portion of the source region including the projection portion and the deviated portion on the source line are connected to each other by the first conductor plug.

3. A semiconductor storage device comprising:

a source region formed in an element region formed on a semiconductor substrate;

a first drain region formed in the element region on one side of the source region;

a first gate electrode formed on a first channel region between the source region and the first drain through a first gate insulating film;

a second drain region formed in the element region on the other side of the source region;

a second gate electrode formed in a second channel region between the source region and the second drain region through a second gate insulating film;

a first word line including the first gate electrode and extending in a first direction;

a second word line including the second gate electrode and extending in the first direction;

a source line extending in a second direction intersecting with the first direction, overlapping with the source region in planar view, and connected to the source region through a first conductor plug;

a first magnetoresistive effect element formed above the first drain region and connected to the first drain region through a second conductor plug;

a second magnetoresistive effect element formed above the second drain region and connected to the second drain region through a third conductor plug;

and a bit line formed on a layer higher than the source line, extending in the second direction, connected to the first magnetoresistive effect element through a fourth conductor plug, and connected to the second magnetoresistive effect element through a fifth conductor plug, wherein the source region is deviated in the first direction in relation to the first drain region and the second drain region, the source line includes a projection portion projecting in the first direction so as to overlay the source region, and the source region and a portion of the source line including the projection portion are connected to each other by the first conductor plug.

4. The semiconductor storage device according to claim 3, wherein the first channel region is formed to be oblique with reference to the second direction, and the second channel region is formed to be oblique with reference to the second direction.

* * * * *